United States Patent [19]

Smith

[11] Patent Number: 5,644,232

[45] Date of Patent: Jul. 1, 1997

[54] QUANTITATION AND STANDARDIZATION OF MAGNETIC RESONANCE MEASUREMENTS

[75] Inventor: Justin P. Smith, Kirkland, Wash.

[73] Assignee: University of Washington, Seattle, Wash.

[21] Appl. No.: 153,118

[22] Filed: Nov. 15, 1993

Related U.S. Application Data

[63] Continuation-in-part of Ser. No. 883,565, May 15, 1992, Pat. No. 5,311,131.

[51] Int. Cl.$^6$ .................................................. G01R 33/48
[52] U.S. Cl. .................... 324/309; 324/308; 128/653.2
[58] Field of Search .................................. 324/309, 307, 324/300, 318, 308; 128/653.2

[56] References Cited

U.S. PATENT DOCUMENTS

| | | | |
|---|---|---|---|
| 4,642,778 | 2/1987 | Hieftje et al. | 364/498 |
| 4,701,705 | 10/1987 | Rollwitz | 324/306 |
| 4,734,646 | 3/1988 | Shendy et al. | 324/309 |
| 4,736,751 | 4/1988 | Gevins et al. | 128/732 |
| 4,973,111 | 11/1990 | Haacke et al. | 324/309 |
| 5,003,979 | 4/1991 | Merickel et al. | 128/653.2 |
| 5,049,819 | 9/1991 | Dechene et al. | 324/307 |
| 5,218,299 | 6/1993 | Dunkel | 324/307 |
| 5,218,529 | 6/1993 | Meyer et al. | 364/413.01 |
| 5,302,896 | 4/1994 | Dechene et al. | 324/307 |
| 5,302,897 | 4/1994 | Tache et al. | 324/307 |
| 5,311,131 | 5/1994 | Smith | 324/309 |
| 5,319,308 | 6/1994 | Dechene et al. | 324/307 |
| 5,367,260 | 11/1994 | Dechene et al. | 324/307 |
| 5,420,508 | 5/1995 | Smith | 324/307 |

OTHER PUBLICATIONS

Oppelt, A., "Entwicklung und Erprobung von Funktionsmustern fur die Kernspintographie," *Siemens Forschungs Und Entwicklungsberichte*, vol. 15, no. 2, pp. 78–85, (1986).

Hylton, N. M., et al., "Information Processing in Magnetic Resonance Imaging," *Critical Reviews in Diagnostic Imaging*, 26(4):325 (1986).

Pearce, R.B., "Expert Systems Enable Computers to Share in Imaging Decisions," *Diagnostic Imaging*, pp. 146–152 (1987).

Vannier, et al., "Multispectral Magnetic Resonance Image Analysis," *CRC Critical Reviews in Biomedical Engineering*, 15;117–144 (1987).

Jungke, M., et al., "Information Processing in Nuclear Magnetic Resonance Imaging," *Magnetic Resonance Imaging*, 6:683–693 (1988).

(List continued on next page.)

*Primary Examiner*—Walter E. Snow
*Assistant Examiner*—Raymond Y. Mah
*Attorney, Agent, or Firm*—Townsend and Townsend and Crew LLP

[57] ABSTRACT

An MRI apparatus and method useful for both industrial applications and medical applications is provided. The apparatus and procedures are capable of estimating the value of a continuous property, such as concentration, viscosity or the like by interpolating or extrapolating from a model derived from training sets of data representing measurements of samples with known properties. A number of techniques are provided for objectifying the analysis. Cluster analysis techniques can be used to supplement, assist or replace subjective judgments by trained operators. Calculations or judgments regarding similarity can be made with respect to stored libraries of signatures, particularly where the library of stored signatures is obtained objectively, e.g., using cluster analysis, standardization and calibration. The signatures can be expanded signatures which include non-MR as well as MR data. Inhomogeneities in the field of a particular MR device can be corrected for based on measurements of a calibration standard having a homogeneous make up. MR measurements taken through different planes of a body or different times can be standardized by including, in at least some of the fields of view, a calibration standard which has a known MR signature.

15 Claims, 23 Drawing Sheets

OTHER PUBLICATIONS

DeLaPaz, R.L., et al., "Computerized Analysis and Information Extraction of Medical Magnetic Resonance Images (MRI)," *SPIE*, 902:151–154 (1988).

Nyman, et al., "An Attempt to Characterize Malignant Lymphoma in Spleen, Liver, and Lymph Nodes with Magnetic Resonance Imaging," *Yearbook of Diagnostic Radiology*, pp. 294–295 (1989).

Grahn, H., et al., "Tissue Discrimination in Magnetic Resonance Imagining: A Predictive Multivariate Approach," *Chemometrics and Intelligent Laboratory Systems*, 7:87–93 (1989).

Meeting Abstract, *Radiology*, 173CP:227–228 (1989).

Hyman, et al., "Characterization of Normal Brain Tissue Using Seven Calculated MRI Parameters and a Statistical Analysis System," *Magnetic Resonance in Medicine*, vol. 11, No. 1, pp. 22–34, (1989).

Kapouleas, T., "Segmentation and Feature Extraction for Magnetic Resonance Brain Image Analysis," *10th International Conference on Pattern Recognition*, pp. 583–590, (1990).

Merickel, et al., "Diseased Tissue Identification and Quantification Utilizing MRI," *Proc. of the 12th Annual Int'l Conf. of the IEEE Engineering in Medicine and Biological Society*, vol. 12, pp. 394–395, (1990).

Bydder, G.M., "Interpretation and Clinical Application of Magnetic Resonance Imaging," *IEEE Transactions on Magnetics*, vol. 26, No. 5, pp. 2089–2091, (1990).

Tzalmona, A., et al., "Detection of Chemical Waves by Magnetic Resonance Imaging," *Chemical Physics Letters*, 174:199–202 (1990).

Wang, Y., et al., "Multivariate Instrument Standardization," *Analytical Chemistry*, 63:2750–2756 (1991).

*Resonance Newsletter*, No. 25, pp. 1–22, Oct., 1991.

Madsen, et al, "Low–Contrast Focal Lesion Detectability Phantom for 1H MR Imaging," *Medical Physics*, vol. 18, No. 3, pp. 549–554, (1991).

Tien, R.D., "Fat–Suppression MR Imaging in Neuroradiology: Techniques and Clinical Application," *American Journal of Roentgenology*, 158:369–379 (1992).

Sharaf, M.A., et al., "Chemical Analysis: A Series of Monographs on Analytical Chemstry and its Applications," *Wiley–Interscience Publication*, 82:281–295 (1986).

Grahn, H., et al., "Data Analysis of Multivariate Magnetic Resonance Images," pp. 1–37 (1988).

Geladi, P., et al., "Principal Component Analysis on Multivariate Images." (1988).

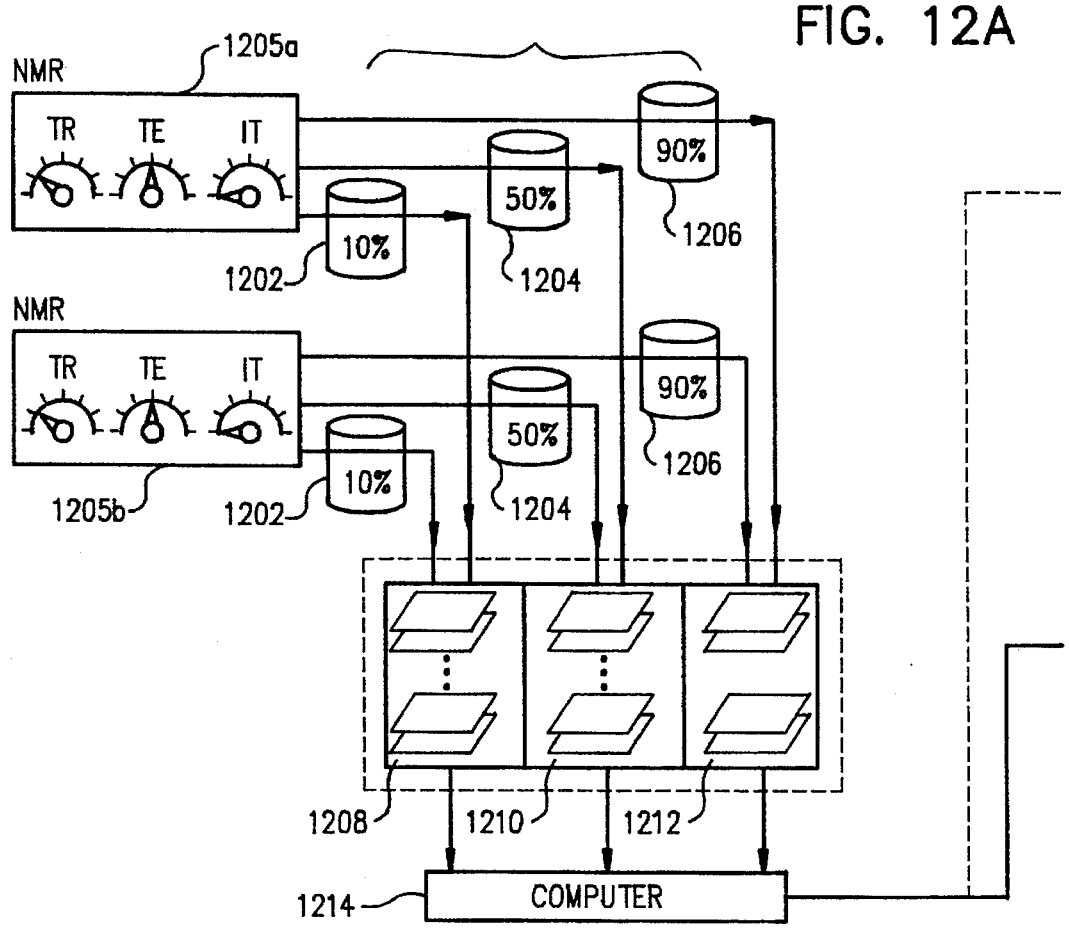
FIG. 12A
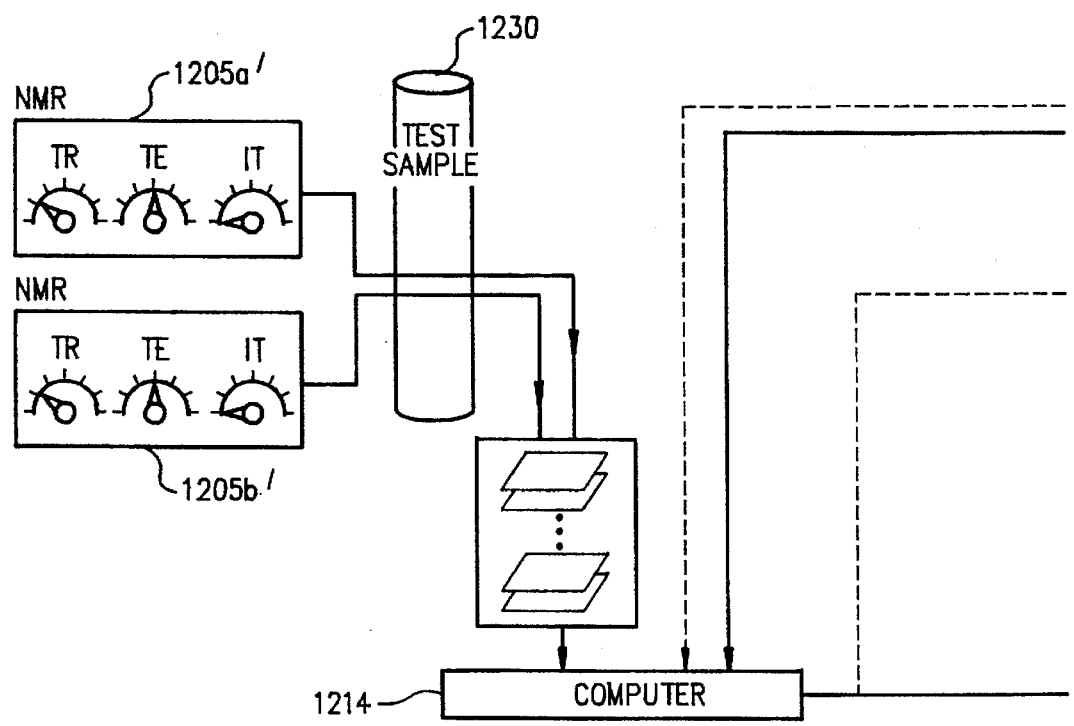

QUANTITATION AND STANDARDIZATION OF MAGNETIC RESONANCE MEASUREMENTS

This application is a continuation-in-part application of commonly-assigned U.S. Ser. No. 07/883,565, filed May 15, 1992 now Pat. No. 5,311,131 incorporated herein by reference.

The present invention relates to magnetic resonance imaging (MRI), and in particular to quantitation and standardization of both medical and industrial applications of MRI.

BACKGROUND OF THE INVENTION

Magnetic resonance measurements have been used in both non-medical and medical applications. In a typical non-medical application, a sample or a body of non-living matter is subjected to a static magnetic field and an oscillating radiofrequency field. The radiofrequency field electrically excites hydrogen atoms in the sample or body. After the oscillating field is turned off, the intensity of proton oscillation is measured, e.g., using an antenna, typically configured to detect the intensity of oscillations in a plurality of locations in a two-dimensional plane.

In a typical medical application of MRI, a patient is placed within the bore of a large, donut-shaped magnet. The magnet creates a static magnetic field that extends along the long (head-to-toe) axis of the patient's body. An antenna (e.g., a coil of wire) is also positioned within the bore of the large magnet, and is used to create an oscillating radiofrequency field that selectively excites hydrogen atoms (protons) in the patient's body into oscillation. The oscillating field is then turned off, and the antenna is used as a receiving element, to detect the proton oscillations as a function of position within the body. Typically, the intensity of the oscillations is measured throughout a two-dimensional plane. When the intensities are displayed as a function of position in this plane, the result is an image that often bears a striking resemblance to the actual anatomic features in that plane. Although MRI typically involves visual display of data, "imaging" can involve purely digital analysis and output so that, in this context, "imaging" does not necessarily require visually-perceptible output.

The intensity of proton oscillations detected at a given point in the patient's body is proportional to the proton density at that point. Because different types of tissues have different proton densities, different tissue types usually have different image intensities, and therefore appear as distinct structures in the MR image. However, the signal intensity also depends on physical and chemical properties of the tissues being imaged. In a simplified model of MRI, the detected signal intensity, as a function of position coordinates x and y in the plane being imaged is proportional to:

$$(1 - e^{-TR/T_1}) e^{-TE/T_2} \quad (1)$$

The parameters TR (recovery time) and TE (echo delay time) are under the control of the operator of the MR imaging system, and are constants for any given image. However, $T_1$ and $T_2$ are functions of the tissue under examination, and therefore vary with position in the x-y plane. By suitable selection of parameters TR and TE, either the $T_1$ or the $T_2$ term in Equation 1 can be made to dominate, thereby producing so-called "$T_1$-weighted" and "$T_2$-weighted" images, respectively.

One of the more important medical uses to which MRI has been put to date is to noninvasively scan a portion of a patient's body, in an attempt to identify benign or malignant tumors. When MRI is used in this fashion, it is necessary to have some methodology for concluding that a given portion of an MR image represents tumor, as opposed to other tissue types such as fat, cyst, etc. One known approach to identifying tissue type has been to acquire multiple MR images of the same region of the patient's body, using different imaging parameters, e.g., using different value of the TR and TE parameters. To take a simplified example, if it were known that a given tumor produced a high image intensity at a first parameter setting, a low image intensity at a second parameter setting, and a high image intensity at a third parameter setting, then a portion of a patient's body that produced that pattern of intensities (high, low, high) could be tentatively identified as tumor.

Pattern recognition approaches of this type are described in U.S. Pat. No. 5,003,979. This patent describes a system for the detection and display of lesions in breast tissue, using MRI techniques.

Many previous applications of magnetic resonance measurements have been directed to determining whether a substance or tissue is or is not of a particular type (e.g., whether a portion of a body being imaged is or is not fat). Other applications have been directed to determining whether a portion of a body being imaged falls into one of a small number of discrete categories (e.g., fat, cyst, or tumor). Non-parametric magnetic resonance imaging techniques have typically not been used for effectively and efficiently quantitizing a continuous property (such as viscosity or concentration of a substance within a body or sample).

In previous MRI techniques, analysis of results have often included a subjective or non-automatic component, such as a step of classifying or identifying portions of an image using judgment of a skilled observer. Accordingly, it would be useful to include techniques to more objectively or automatically categorize or analyze MR data.

In many cases, comparison of the pattern of intensities of a patient's tissue to "standard" patterns for different tissue types does not produce results of sufficient accuracy. One problem appears to be that attempts to define a single "standard" pattern for a given tissue type does not take sufficient account of possible variability in tissue of a given type. Another problem appears to be that there is substantial variability from one patient or sample to the next as well as from one MRI machine to the next or within different regions or fields of view of the same MRI machine.

Cancer treatment often includes detecting when a primary tumor has spread to other sites in the patient's body, to produce so-called secondary tumors, known as metastases. This process, using MRI or other imaging techniques, is often complicated by the fact that a remote lesion discovered during staging could represent either a metastasis or a benign incidental finding. A number of benign lesions (such as hepatic hemangiomas and nonfunctioning adrenal adenomas) occur as frequently in patients with a known primary tumor as they do in the general population.

Resolving this dilemma requires additional imaging studies or biopsy, but often significant uncertainty persists. Biopsy may expose the patient to substantial risk when the lesion in the brain or mediastinum, or when the patient has impaired hemostasis. Even when biopsy does not present a significant risk to the patient, it may be technically challenging, such as sampling focal lesions in vertebral marrow.

SUMMARY OF THE INVENTION

For the reasons set forth above, it would be useful to have a method that could use MR data to estimate the value of a continuous property such as concentration, viscosity or the like for both industrial applications and medical applications. It would further be useful to have a method which reduces or eliminates the need for subjective analysis of MRI data.

It would also be useful to provide a method that takes account of variability among "standard" substances or tissue types, takes account of variability from patient to patient, among different MRI machines and within different regions or fields of view of the same MRI machine. Particularly with regard to medical applications, it would be useful to provide a method that could noninvasively measure the similarity between a known primary tumor and a remote lesion of unknown tissue type. The clinician would use the measured similarity to determine the likelihood that the two lesions represent the same tissue. Such a method could be used to distinguish a pathological fracture from a benign osteoporotic compression fracture in a patient with a known primary tumor. Similarly, the method could be used to distinguish a metastasis from an infarction in a patient with lung cancer who presents with a supratentorial solitary enhancing lesion. Using the computed similarity to determine the likelihood that two lesions represent the same tissue would significantly improve the confidence of non-invasive imaging diagnosis.

According to the present invention, magnetic resonance data is provided in a way which is useful for both medical and non-medical (e.g., industrial) applications. In one embodiment, an MRI apparatus is used to produce a training set comprising one or more training samples. The training set is formed from a congruent set of first images of a training region of the body being studied. The term "congruent" refers to the fact that each of the first images represents the same physical slice or plane through the body. In an industrial application, the training region may be, e.g., a sample of a known substance or a sample of a substance with a particular characteristic such as, e.g., a sample of oil having a known viscosity. In a medical application, the training region may be, e.g., the region of a known primary tumor. The first images are produced using a predetermined set of MRI pulse sequences that differ from one another. Each first image comprises an array of pixels, and each training sample comprises a spatially aligned set of pixels from each first image.

MRI apparatus is also used to produce a test set comprising a plurality of test samples. The test set is formed from a congruent set of second images of a test region of the test body. In an industrial application, the test region may comprise, e.g., an unknown substance or a substance with unknown characteristics, e.g., an oil with unknown viscosity. In a medical application, the test region may comprise, e.g., a region to be scanned for a secondary tumor. The second images are produced using the same MRI pulse sequences as the first images. Each second image comprises an array of pixels and each test sample comprises a spatially aligned set of pixels from each second image.

According to one embodiment, for each test sample, one then produces similarity data indicating the degree of similarity between the test sample and the training samples. A display is then produced based upon the similarity data. The display identifies the test samples having the highest degree of similarity to the training samples. For example, one of the second images may be displayed using a conventional gray scale, while the most similar pixels are highlighted in color. In an industrial application, the display might, e.g., highlight those samples, among a plurality of oil samples, having a viscosity matching the viscosity of a training set. In the secondary tumor example, the regions of the second image that are highlighted in color will correspond to those regions most similar to the first region (the training set) which comprises the primary tumor. The color highlighted regions will therefore identify possible sites of secondary tumors.

In another aspect, the invention also provides for the generation of spatial correlation images based on each of the first and second images, and the use of the spatial correlation images in combination with the first and second images to produce the training and test samples. Instrument standardization techniques may also be applied, to minimize errors when the first and second images are acquired from different planes through the body, or at different times. In another aspect, the present invention may provide a technique for suppressing or enhancing certain tissue types in an MR image.

According to one aspect of the invention an MRI apparatus and method useful for both industrial applications and medical applications is provided. The apparatus and procedures are capable of estimating the value of a continuous property, such as concentration, viscosity or the like by interpolating or extrapolating from a model derived from training sets of data representing measurements of samples with known properties. A number of techniques are provided for objectifying the analysis. Cluster analysis techniques can be used to supplement, assist or replace subjective judgments by trained operators. Calculations or judgments regarding similarity can be made with respect to stored libraries of signatures, particularly where the library of stored signatures is obtained objectively, e.g., using cluster analysis, standardization and calibration. The signatures can be expanded signatures which include non-MR as well as MR data. Inhomogeneities in the field of a particular MR device can be corrected for based on measurements of a reference standard having a homogeneous make up. MR measurements taken through different planes of a body or different times can be standardized by including, in at least some of the fields of view, a reference standard which has a known MR signature.

According to one embodiment, the invention includes a method for identifying which, among a first plurality of regions in a first non-homogenous part of a body are most similar to a second plurality of regions in a second non-homogeneous part of a body, comprising obtaining MR measurements of each of said first and second parts of said body, defining first and second pluralities of clusters of regions of said first and second part of said body, respectively, using cluster analysis, the regions in each cluster of regions of said first and second pluralities of clusters having similar MR measurements, forming first visual displays, each of said first visual displays, including said first part of said body, said first visual displays including visual indicia identifying at least some of said first plurality of clusters or regions, selecting one of said first plurality of clusters, based on said first visual displays, as a first cluster of interest, forming second visual displays, each of said second visual displays including said second part of said body, said second visual displays including visual indicia identifying at least some of said second plurality of clusters, selecting one of said second plurality of clusters, based on said second visual displays, as a second cluster of interest, and calculating a measure of similarity between the MR measurements for said first clusters of interest and the MR measurements for said second cluster of interest.

According to another embodiment, the invention includes a method for identifying which, among a first plurality of regions in a first non-homogenous part of a body are most similar to a second plurality of regions in a second non-homogeneous part of a body, comprising obtaining MR measurements of each of said first and second parts of said body, defining first and second pluralities of clusters of regions of said first and second part of said body, respectively, using cluster analysis, the regions in each cluster of regions of said first and second pluralities of clusters having similar MR measurements, calculating a measure of similarity between MR measurements for a plurality of pairs of clusters, each pair of clusters in said plurality of pairs of clusters comprising a cluster from said first plurality of clusters and a cluster from said second plurality of clusters, selecting at least some of said pairs of clusters, based on said measures of similarity, as pairs of interest, and forming visual displays including visual indicia distinguishably identifying at least said pairs of interest.

According to another embodiment, the invention includes a method of using magnetic resonance imaging (MRI) to produce an image of a body, the method comprising the steps of using an MRI apparatus to produce a training set comprising one or more training samples, the training set being formed from a plurality of congruent first images of a training region of the body, each first image being produced using an MRI pulse sequence different from the pulse sequences used to produce the other first images, each first image comprising an array of pixels, each training sample comprising a spatially aligned set of pixels from each first image, using an MRI apparatus to produce a test set comprising a plurality of test samples, the test set being formed from a plurality of congruent second images of a test region of the same body, the second images being produced using the same MRI pulse sequences as the first images, each second image comprising an array of pixels, each test sample comprising a spatially aligned set of pixels from each second image, producing similarity data, based on cluster analysis, indicating, for each test sample, the degree of similarity between the test sample and the training samples, and producing a display based upon the similarity data.

According to another embodiment, the invention includes a method for identifying the composition of regions of a body comprising storing a first plurality of MR measurements of a substance having a first composition, storing a second plurality of MR measurements of a substance having a second composition, obtaining MR measurements of a non-homogeneous portion of said body, identifying at least a first region of said non-homogeneous portion of said body by applying cluster analysis to said MR measurements, calculating measures of similarity between the MR measurements for said first region and at least said first and second plurality of MR measurements, and identifying one of said first composition and said second composition as the composition of said region based on said measures of similarity. In this case, the method can also include displaying at least one image of said body, with visual indicia based on composition of said region and/or displaying a plurality of images of said body in real time to provide an indication of changes or movement of said first or second composition and/or a step of standardization.

According to another embodiment, the invention includes a method for identifying the composition of regions of a body comprising obtaining MR measurements of a portion of said body, including said region, obtaining a second measurement of said portion of said body, said second measurement being different from said MR measurement, and identifying the composition of said region using both said MR measurement and said second measurement. The step of obtaining MR measurements can include recalling at least some of a library of stored MR measurements from a memory device. The step of identifying include calculating a measurement of similarity by combining said first measurement of similarity with said second measurement of similarity. Preferably, the portion of said body is a substantially non-homogeneous portion.

According to another embodiment, the invention can include a method for estimating the volume occupied by a substance within a body comprising obtaining first MR measurements of a first plurality of regions in said body, said first plurality of regions substantially defining a first surface passing through a portion of said body each of said first plurality of regions being substantially representative of a volume of said body having a dimension substantially transverse to said first surface, obtaining a second MR measurement of a second plurality of regions in said body, said second plurality of regions substantially defining a second surface, different from said first surface, each of said second plurality of regions being substantially representative of a volume of said body having a dimension substantially transverse to said second surface, identifying a plurality of target regions in said body based on said MR measurements, said target regions having MR measurements which indicate said target region comprising said substance, said target region including at least some of said first and second pluralities of regions, and calculating the sum of the volumes which said target region are representative of.

According to another embodiment, the invention can include a method of using magnetic resonance imaging (MRI) to produce an image of a body, the method comprising the steps of using an MRI apparatus to produce a training set comprising one or more training samples, the training set being formed from a plurality of congruent first images of a training region of the body, each first image being produced using an MRI pulse sequence different from the pulse sequences used to produce the other first images, each first image comprising an array of pixels, each training sample comprising a spatially aligned set of pixels from each first image, using an MRI apparatus to produce a test set comprising a plurality of test samples, the test set being formed from a plurality of congruent second images of a test region of the same body, the second images being produced using the same MRI pulse sequences as the first images, each second image comprising an array of pixels, each test sample comprising a spatially aligned set of pixels from each second image, producing similarity data indicating, for each test sample, the degree of similarity between the test sample and the training samples, and calculating a volume by identifying those pixels having at least a first degree of similarity and multiplying the number of said pixels by the volumes of said body represented by said pixels.

According to another embodiment, the invention includes a method of accounting for inhomogeneities in fields produced by an MR apparatus comprising positioning a first substantially homogeneous reference material at least within a first field of view of said MR apparatus, obtaining first MR measurements in a first plurality of region of said reference material, said first plurality of regions being within said first field of view, calculating correction factors for at least some of said first plurality of regions, based on said MR measurements of said reference material, obtaining second MR measurements in a second plurality of regions of a test substance, said second plurality of regions being within said first field of view, and combining said correction factor with said second MR measurements to provide corrected MR measurements for said second plurality of regions. The steps of calculating comprise dividing first values by the MR intensity for each of said first plurality of regions. The first value can be an average intensity. Each of said second plurality of regions can be spatially coupled with one of said first plurality of regions and the step of combining can include multiplying the intensity for each of said second plurality of regions by the corresponding correction factor. The reference material can be, e.g., a cuprous sulfate solution. The first MR measurements can comprise measurements using at least first and second sequences and the method can also include calculating separate correction factors for said first and second sequences and/or different locations within the test substance.

According to another embodiment, the invention includes a method of using magnetic resonance imaging (MRI) to produce an image of a test object, the method comprising the steps of using an MRI apparatus to produce a training set comprising one or more training samples, the training set being formed from a plurality of congruent first images of a training region of a first object, each first image being produced using an MRI pulse sequence different from the pulse sequences used to produce the other first images, each first image comprising an array of pixels, each training sample comprising a spatially aligned set of pixels from each first image, at least some of said first images including an image of at least one training set reference object, using an MRI apparatus to produce a test set comprising a plurality of test samples, the test set being formed from a plurality of congruent second images of a test region of the test object, the second images being produced using the same MRI pulse sequences as the first images, each second image comprising an array of pixels, each test sample comprising a spatially aligned set of pixels from each second image, at least some of said second images including an image of at least one test set reference object substantially similar to said test set reference object, producing similarity data indicating, for each test sample, the degree of similarity between the test sample and the training samples, correcting at least part of said similarity data based on differences between said image of said training set reference object and said image of said test set reference object, and producing a display based upon the similarity data.

According to another embodiment, the invention can include a method of using magnetic resonance imaging (MRI) to produce an image of a body, the method comprising the steps of using an MRI apparatus to produce a training set comprising one or more training samples, the training set being formed from a plurality of congruent first images of a training region of the body, each first image being produced using an MRI pulse sequence different from the pulse sequences used to produce the other first images, each first image comprising an array of pixels, each training sample comprising a spatially aligned set of pixels from each first image, using an MRI apparatus to produce a test set comprising a plurality of test samples, the test set being formed from a plurality of congruent second images of a test region of the same body, the second images being produced using the same MRI pulse sequences as the first images, each second image comprising an array of pixels, each test sample comprising a spatially aligned set of pixels from each second image, producing similarity data indicating, for each test sample, the degree of similarity between the test sample and the training samples, producing a first image based on at least some of said second congruent images, producing a second image which displays only those portions of the first image which are within a user-defined similarity threshold of a portion of said training set, and subtracting said second image from said first image to produce a third image.

According to another embodiment, the invention can include a method of using magnetic resonance imaging (MRI) to produce an image of a body, the method comprising the steps of using an MRI apparatus to produce a training set comprising one or more training samples, the training set being formed from a plurality of congruent first images of a training region of the body, each first image being produced using an MRI pulse sequence different from the pulse sequences used to produce the other first images, each first image comprising an array of pixels, each training sample comprising a spatially aligned set of pixels from each first image, using an MRI apparatus to produce a test set comprising a plurality of test samples, the test set being formed from a plurality of congruent second images of a test region of the same body, the second images being produced using the same MRI pulse sequences as the first images, each second image comprising an array of pixels, each test sample comprising a spatially aligned set of pixels from each second image, producing similarity data indicating, for each test sample, the degree of similarity between the test sample and the training samples, producing a first image based on at least some of said second congruent images, calculating, for each of a plurality of pixels within at least a part of said first image, a difference value indicating the magnitude of the difference between the MR data corresponding to said pixel and at least a first portion of the MR data from said training set, and producing a second image including visual indicia indicating, for said plurality of pixels at least first and second different levels based on said difference value.

According to another embodiment, the invention can include a method of using magnetic resonance imaging (MRI) to produce an image of a test object, the method comprising the steps of using an MRI apparatus to produce a training set comprising one or more training samples, the training set being formed from a plurality of congruent first images of a training region of a first object, each first image being produced using an MRI pulse sequence different from the pulse sequences used to produce the other first images, each first image comprising an array of pixels, each training sample comprising a spatially aligned set of pixels from each first image, using an MRI apparatus to produce a test set comprising a plurality of test samples, the test set being formed from a plurality of congruent second images of a test region of the test object, the second images being produced using the same MRI pulse sequences as the first images, each second image comprising an array of pixels, each test sample comprising a spatially aligned set of pixels from each second image, producing similarity data representing distance in a multi-dimensional measurement space producing a display based upon the similarity data.

BRIEF DESCRIPTION OF THE DRAWINGS

FIG. 12A–B is a schematic and block diagram of an MR process which estimates a value of a continuous property;

DESCRIPTION OF THE PREFERRED EMBODIMENT

Figure 1:
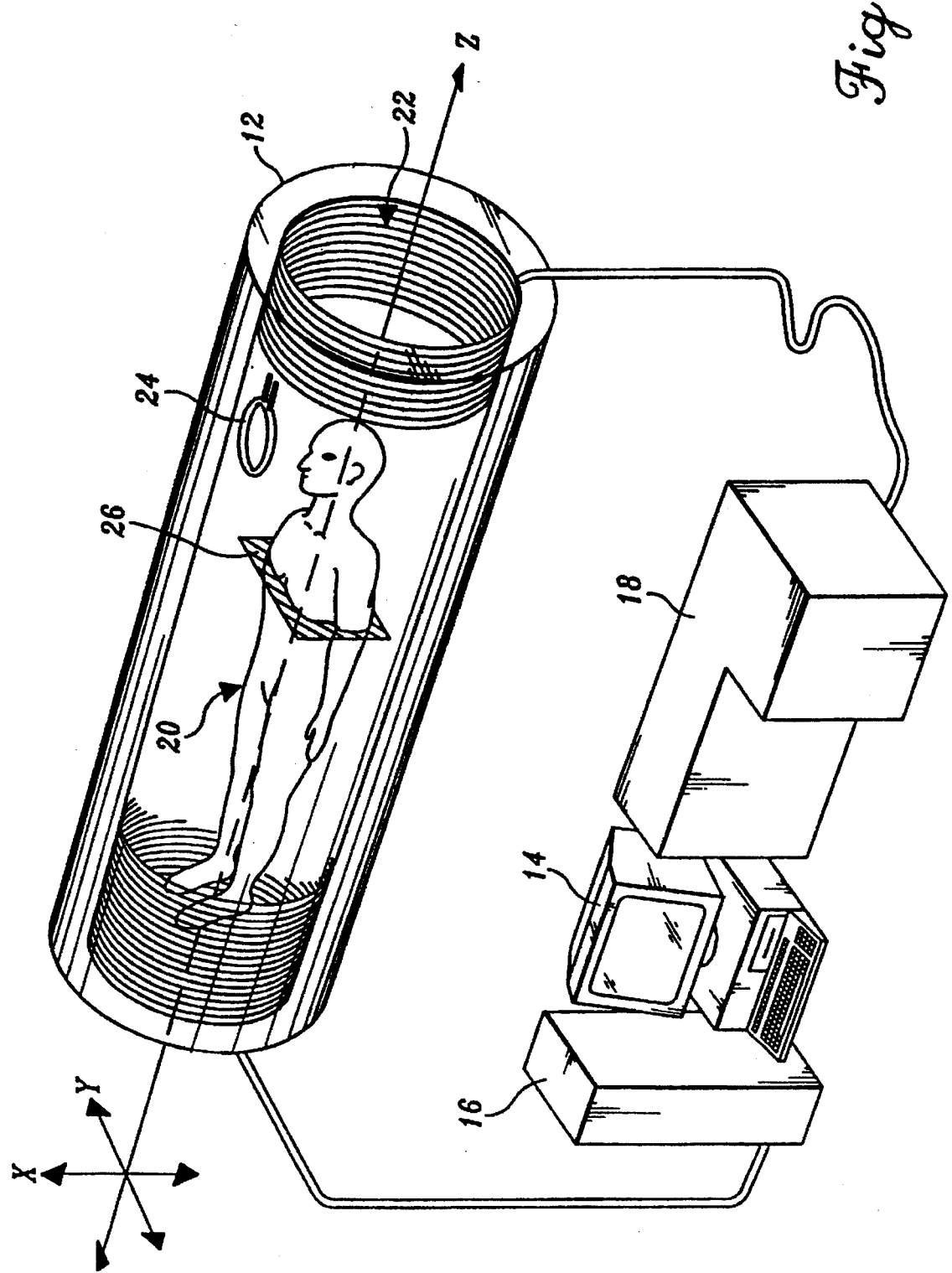
FIG. 1 is a schematic perspective view of an MRI imaging apparatus.

FIG. 1 presents a simplified schematic view of a conventional apparatus for performing magnetic resonance imagining. The apparatus comprises housing 12, computer 14 that serves as an operator console, power supply module 16, and signal processing module 18. Housing 12 has the form of a hollow cylinder that surrounds the object on which imaging is to be performed. In the depicted embodiment, imaging is being performed on a human patient 20. The present invention can, however, be applied to a wide variety of types or collections of test bodies for various industrial applications. For example, the object(s) to be imaged can include a crate of apples (e.g., to identify apple varieties, condition, size, etc.), a case of wine bottles (to identify type, variety, vintage quality, condition, etc.), a block of frozen fish (to identify species, freshness, etc.) or a chromatography column (to identify and/or track progress of a substance).

The housing includes field coil 22 that is used to create a static magnetic field along the central cylindrical axis (z axis) of the housing. The housing also includes antenna 24 that is used both to apply an oscillating radiofrequency field, and then to detect the response function, i.e., radiofrequency signals produced by the body in response to the applied static and oscillating fields. The signals detected by the antenna are coupled to signal processing module 18 where they are amplified, conditioned, and digitized for storage in computer 14. The computer processes the stored data and produces and displays an image of one or more planes or slices 26 through the body.

Unlike computed tomography (CT), magnetic resonance (MR) imaging generates data that are well-suited for quantitative analysis. This is because the MR signal intensity is determined by several variables; hence MR data are said to be multidimensional. It is the multidimensional nature of MR signals that allows them to be analyzed by the group of multivariate statistics known as pattern recognition methods.

Pattern recognition methods have become widely used in science and medicine because they can achieve greater accuracy with lower cost than can traditional methods of data analysis. For example, suppose that we wish to identify an unknown chemical compound by comparison to a library of standard compounds. One approach is to obtain a proton nuclear magnetic resonance (NMR) spectrum of the compound and to compare it to the spectra of known standards. By using an NMR spectrometer of sufficiently high resolution, even closely-related compounds can often be distinguished from one another. However, the accuracy of even these instruments is limited, and their limited availability make this approach infeasible for many investigators.

An alternative approach is to use pattern recognition methods. Instead of trying to identify a compound by making a single high-resolution measurement, the pattern recognition approach relies on combinations of low-resolution measurements. For example, spectra of the unknown compounds would be obtained from low resolution MR, near-infrared, and mass spectrometers. Multivariate statistics would then be used to compare these three spectra to a library of reference spectra. Combining low resolution measurements made by different modalities usually results in more accurate identification than could be achieved by a high-resolution MR spectrometer alone.

The ability of pattern recognition methods to recognize similarities between samples is related to the discriminating variance of the data that describe the samples. The greater the discriminating variance of the data, the greater the potential resolution of the pattern recognition method. It is often possible to obtain greater discriminating variance by combining several low-resolution measurements made on different modalities that can be obtained with measurements made on a single high-resolution instrument.

With conventional MR imaging, the user prospectively chooses pulse sequences that are believed most likely to answer the question being studied. With the present invention, however, the user applies sequences that have been chosen to maximize the information (variance) acquired from a the sample being tested. The user then applies pattern recognition techniques to the data to retrospectively answer the specific clinical question.

The application of pattern recognition techniques to MRI is based on the acquisition of multiple images taken of the same region of a body. The views differ from one another, however, because they are each acquired using different MRI pulse sequences, i.e., using different parameter settings on the MRI apparatus. A set of images acquired in this way are said to be congruent to one another.

Figures 2, 5:
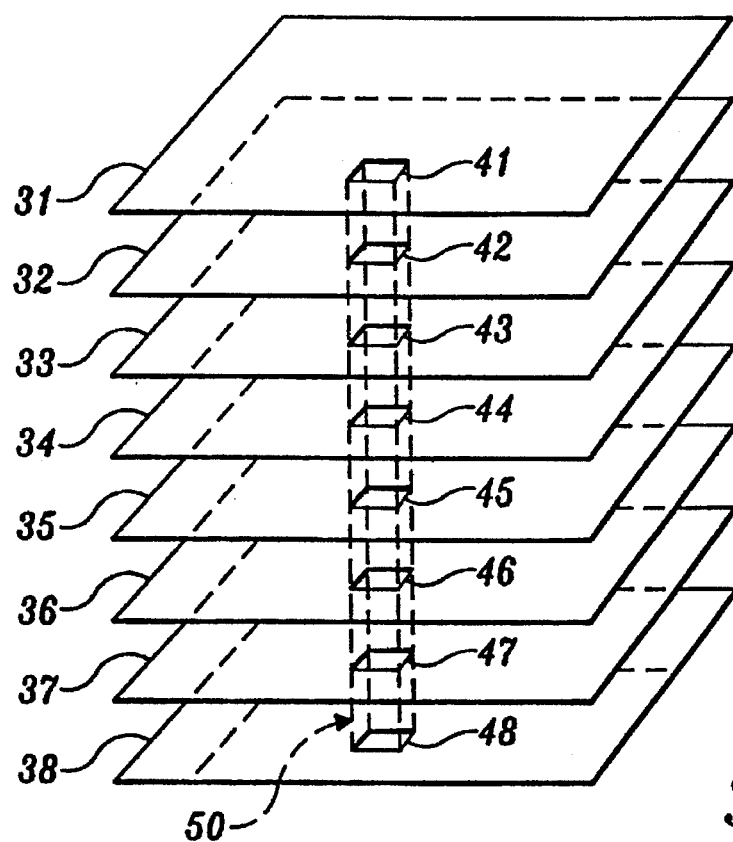
FIG. 2 illustrates the concept of a set of congruent images.
FIG. 5 illustrates the concept of first and second nearest neighbor pixels.

FIG. 2 schematically illustrates a set of eight congruent images 31–38. All images are acquired from the same slice of plane through a body, using different parameter settings for each image. In one embodiment, images 31–38 are all acquired using the same MR instrument, as close in time to one another as practical. In other embodiments, the images may be acquired using different MR instruments and/or may be acquired at different times. Each image comprises a rectangular or square array of pixels, represented by pixel 41 of image 31. By way of example, there may be 256 pixels along one direction (the frequency encoding dimension), and 64–256 pixels along the other direction (the phase encoding dimension), depending upon the particular pulse sequence used. However, other numbers of pixels could also be used. Images 32–38 include pixels 42–48, respectively, that correspond to pixel 41, in that they represent measurements made at the same physical position within the body.

It is important to recognize that the acquired resolution of the array (256×64 for example) usually differs from the displayed resolution of the array (typically 512×512). The acquired array is usually interpolated to 512×512, and the interpolated array is then mildly smoothed (typically using a low-pass filter). Both of these operations are performed by the magnetic resonance imager to improve the subjective appearance of the images. The pixel based operations of the present invention may be performed either on the acquired pixels or on the pixels that have been interpolated and smoothed for display. In general, the latter option will be more convenient, and is therefore preferred.

A collection of pixels from the same relative positions within a set of congruent images, and therefore from the same physical position within a body, are referred to herein as a "sample". There is one such sample associated with each pixel position in the region covered by images 31–38. Sample 50 can be thought of as a very low resolution spectrum that contains information concerning the nature of the patient's tissue at the corresponding pixel position. Sample 50 can also be thought of as a vector in a measurement space having eight dimensions.

As previously described, it is desirable for the data represented by a congruent set of images to have as much discriminating variance as possible. This means that the particular parameter settings used to generate the images need to be selected with care, to maximize the usefulness of the data. For the purpose of discriminating tumor from other tissue types, it has been found that the images are preferably generated using the following standard MR pulse sequences: a $T_1$-weighted spin-echo sequence (one image); a six-echo multiple spin-echo (ME-6) sequence (six images); and a short inversion time inversion recovery (STIR) sequence (one image). Suitable echo times for ME-6 sequence are 26/52/78/104/130/156 ms, with TR of 1500 ms. For the STIR sequence, suitable parameters are TR 1800–2000 ms, and an inversion time of 110 ms. This particular combination of pulse sequences generates an eight-image data set having a large variance, and is well-suited to the requirements for multivariate analysis.

In the context of an industrial application, images may be generated using, as an example, the ME-6 sequence, one or more STIR sequences and a $T_1$-weighted spin-echo sequence. In some industrial applications, it may be useful to use additional STIR sequences and/or field-echo or other sequences.

Many other pulse sequences and combinations of pulse sequences can be used for practicing the present invention. One example of another pulse sequence is $T_1$-weighted gradient echo sequence, a fast $T_2$-weighted spin or gradient echo sequence, and a spin or gradient echo sequence adapted for fat suppression. Fat suppression sequences are described in Tien, Robert D., "Fat Suppression MR Imaging in Neuroradiology: Techniques and Clinical Application," *American Journal of Roentgenology* 158:369–379, February 1992, herein incorporated by reference. Magnetization transfer sequences and diffusion sequences may be suitable for certain applications. Contrast materials can also be used to produce a contrast enhanced $T_1$-weighted image. In addition, other spin-echo sequences can be used, with different multiples. For example, 4-echo multiple spin sequence will produce excellent results in many cases. On some MRI devices, an ME-4 sequence has the advantage that it can automatically acquire multiple stacked slices, in a manner typical of most $T_1$-weighted and STIR sequences. For all sequences used, any parameters available with the sequence can, of course, be adjusted to maximize the usefulness of the invention for particular applications. For example, the inversion time for a STIR sequence can generally be adjusted in the range of 30–200 MS, with the higher inversion times generally being suitable for higher field strength systems. With gradient echo sequences, the RF flip angle can be adjusted to maximize the discriminating variance of the data.

Two general approaches for characterizing samples can be used. In one approach, samples can be characterized based upon their similarity to prior, known patterns for a particular substance or tissue. In one example, the prior, known MR patterns represent a composite or average from a number of known samples. This approach, however, does not take into account the variability that may be present in the substance or tissue which forms the prototype. Accordingly, another embodiment involves collecting and storing a library of MR response functions (signatures), spectra or both patterns or spectra for a plurality of samples of a particular substance or tissue.

A second approach involves comparing a sample or region of a body being studied to the spectra for another region or sample from the same body. In the context of a medical application, this approach could involve a comparison of samples from one portion of a patient to other samples for the same patient. For example, referring to FIG. 3A, a congruent set 60 of images is first obtained for a patient. A first group of one or more samples is then selected as training set 62, while a second group of samples is then selected as test set 64. Training set 62 may lie within a known primary tumor, while test set 64 may be an area to be scanned for the presence of a secondary tumor related to the primary tumor.

Once training set 62 and test set 64 have been selected, one then determines the degree of similarity, or the "distance", between each sample in test set 64 and the training set. Suitable techniques for providing a similarity measurement are discussed below. In one approach, the distance from the test sample to each training sample is determined, and then the minimum of these distances is selected. In another approach, an average training sample is computed, and the distance from the test sample to the average training sample is determined.

Once a distance or similarity measure has been determined for each test set sample, one of the images making up test set 64 is displayed, with the "most similar" pixels (e.g., the one percent most similar pixels) highlighted. A preferred highlighting technique is to display the most similar pixels in color, superimposed on a conventional gray scale display of one of the images of the test set. In a medical application, the resulting display has proved to be clinically valuable for permitting a practitioner to identify the extent, if any, to which a primary tumor represented by the training set has spread to regions encompassed by the test set. In an industrial application, the technique will be used, e.g., to verify that all the fish in a large block of frozen fish are the same species and/or are in the same condition of freshness.

Figure 3A:
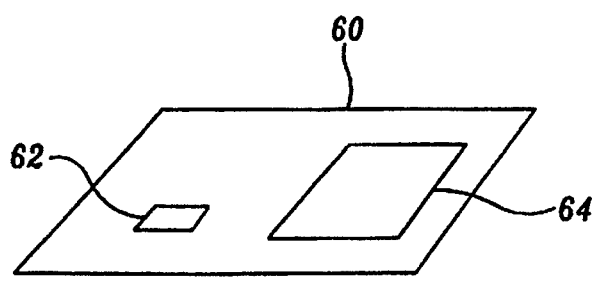
FIGS. 3A–3C illustrate three techniques for forming the training and test sets.
Figure 3B:
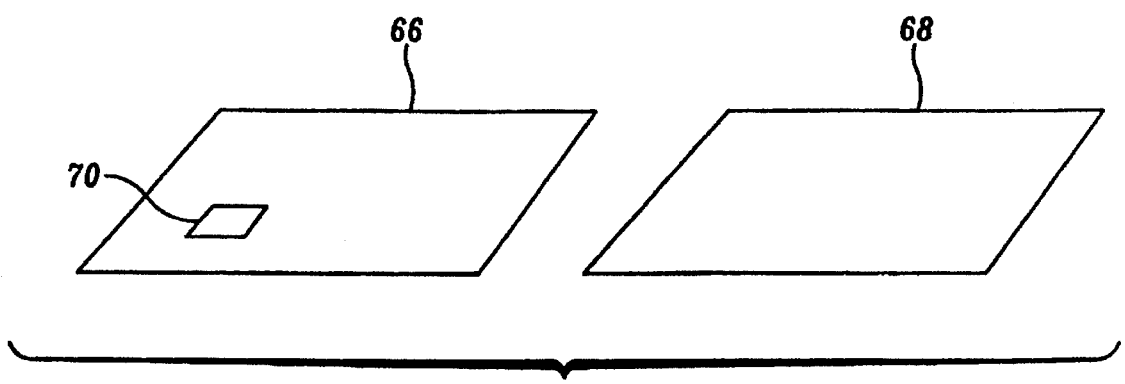
Figure 3C:
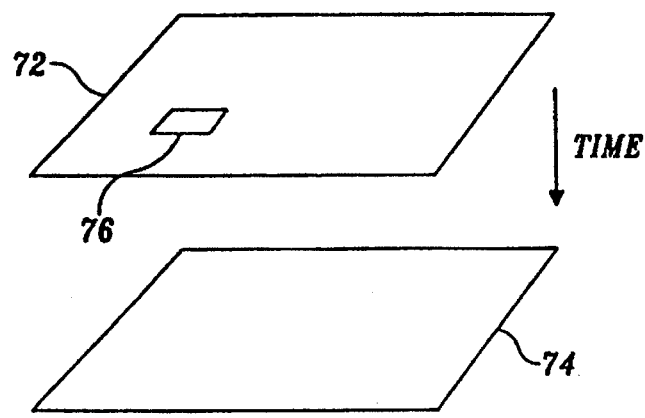

FIGS. 3B and 3C illustrate different techniques for selecting the training and test sets. In FIG. 3B, one obtains two sets 66, 68 of congruent images, for example from two different slices or planes through a body. A training set 70 is selected from set 66, while the entire second set 68 is used as the test set. This variation permits the similarity measurement technique of the present invention to be used to measure the similarity of any two sites within the body, not just two sites within the same image plane.

FIG. 3C illustrates the case in which a first set 72 is acquired at one point in time, and a portion of set 72 is used to form training set 76. At a later point in time, which could be days, weeks or months later, a second congruent set 74 is obtained through the same region of the patient's body, and used to form the test set. In a medical application, this variation can be used e.g., to trace the development of a single tumor and assess its response to therapy, as well as to track the spread of the tumor to other sites in the patient's body. In an industrial application, this variation can be used, e.g., to track the movement of a substance through a chromatography column.

It will be understood that the approaches illustrated in FIGS. 3A–3C are not exhaustive, and that other variations could also be used. For example, the techniques of FIGS. 3B and 3C could be combined, to track the spread of a tumor both in time, and to remote sites in a patient's body.

Figure 4:
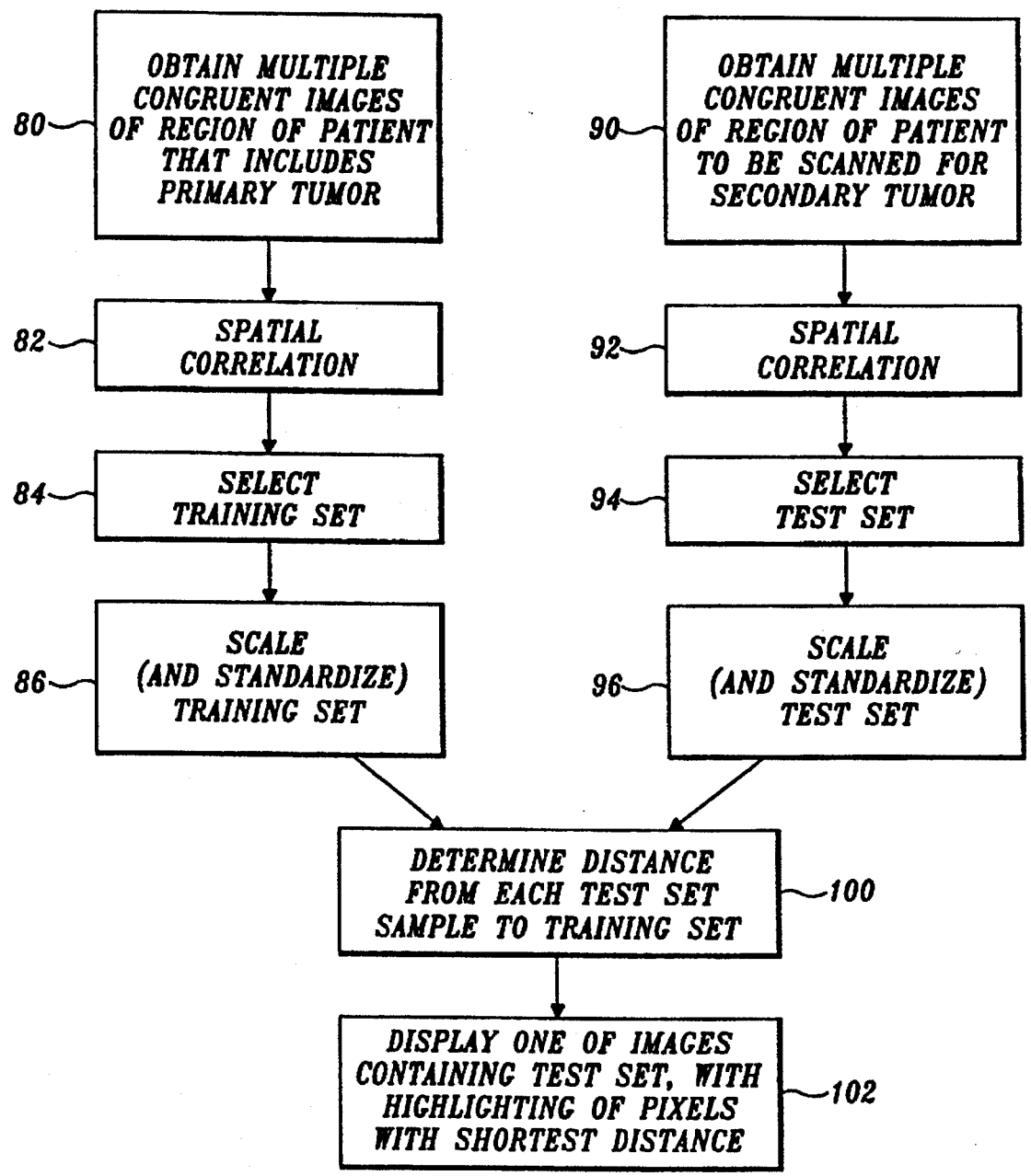
FIG. 4 is a flow chart showing the principal steps of one embodiment of the invention.

FIG. 4 provides a flow chart illustrating steps that can be used to carry out any of the procedures illustrated in FIGS. 3A–3C, to track the spread of a primary tumor. In step 80, a conventional MR imaging apparatus is used to obtain a first set of multiple congruent images of a region of the patient's body that is believed to contain a primary tumor. In step 82, each of the images in the first set is preferably subjected to a spatial correlation procedure which is one class of techniques aimed at the use of texture characteristics of a data set. Two such techniques are outlined in FIGS. 5 and 6. These examples of texture features include angular second moment, contrast, correlation, sum of squares (variance), inverse difference moment, sum average, sum variance, sum entropy, entropy, difference variance, difference entropy, information measures of correlation, and maximal correlation coefficient, as described in Robert M. Haralick, et al., "Textural Features for Image Classification," *IEEE Transactions on Systems, Man, and Cybernetics*, Vol. SMC-3, No. 6, November, 1973, incorporated herein by reference.

Figure 6:
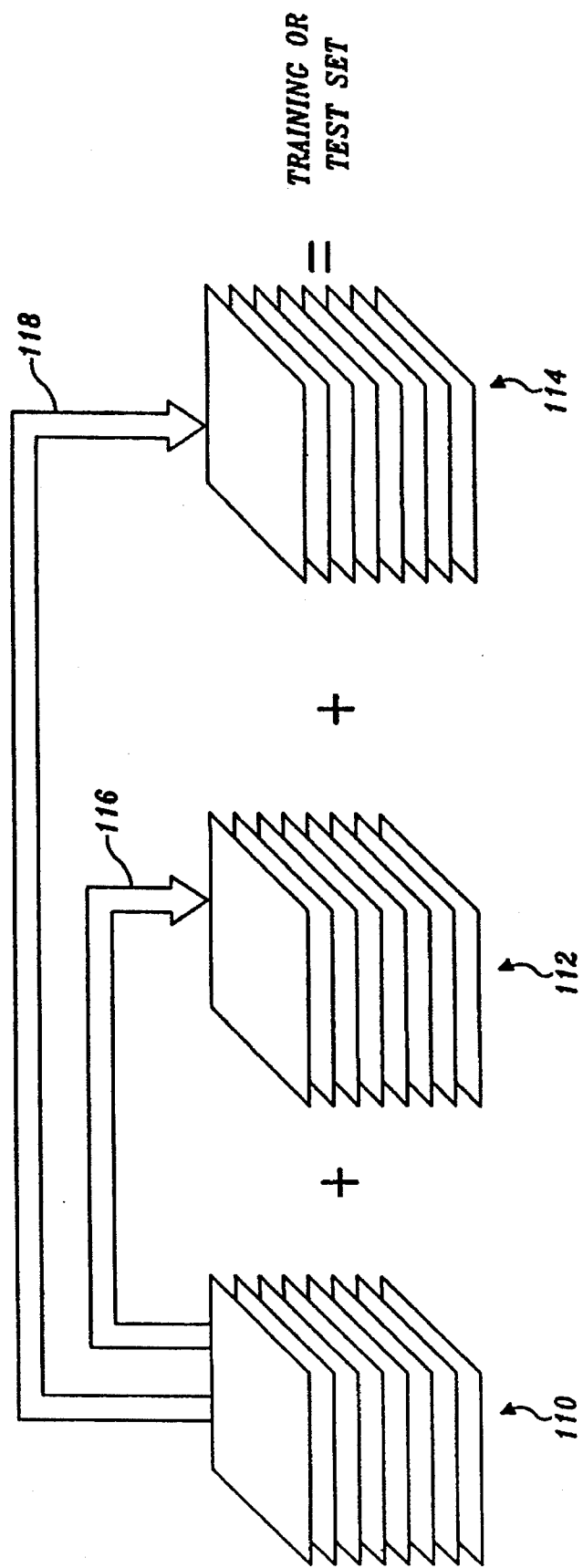
FIG. 6 illustrates the combination of spatial correlation images with the original images to form the training or test set.

Referring to FIG. 5, P represents any pixel in any of images in the first set. For pixel P, the eight bordering pixels, labelled 1 in FIG. 5, are referred to as the first nearest neighbor pixels, while the next group of 16 pixels, labelled 2, are referred to as the second nearest neighbor pixels. In spatial correlation step 82 shown in FIG. 4, each of the "original" images in the first set is processed, separately from the other images, to generate two new images. In the first new image, each pixel has a value equal to the average value of the first nearest neighbor pixels. In the second new image, each pixel has a value equal to the average of the second nearest neighbor pixels. This process is performed for each of the original images in the first set. If there were eight original first set images (as illustrated, for example, FIG. 2), then this step will produce a total of 24 images as shown in FIG. 6. Stack 110 represents the 8 original first set of images; stack 112 represents the 8 new images generated by first nearest neighbor averaging, while stack 114 represents the eight new images produced by the second nearest neighbor averaging. Thus, as a result of the spatial correlation step, there are now a total of 24 congruent images representing a single slice through the body. Thus each sample for this slice has a total of 24 intensity values associated with it.

Returning to FIG. 4, the next step 84 is to select the training set, i.e., a subset of samples in this slice that contain the primary tumor under investigation. Various approaches can be used for selection of the training set. In one approach, selection of the training set involves the exercise of judgment by a trained operator or observer. In another embodiment, selection of the training set may be achieved partially or entirely automatically using an analysis technique such as cluster analysis. In one example of the first approach (selection by a trained observer), the step can be carried out by displaying one of the eight Original images to the operator on a display screen of a computer 14 (FIG. 1). The operator, based on training or experience, views the images and determines which portions are to be used as training set, for example, by recognizing, a portion which appears to be a primary tumor under investigation. The operator then positions a variable-sized box over the image portion to be selected for use as the training set. Selection of a training set by the subjective judgment of the skilled observer may be adequate for many applications in medicine and industry. However, it has the disadvantage of subjectivity.

The problem of subjectivity in set selection can be seen by the following example of a medical application. Suppose that a patient has a 3 cm spherical metastasis within the liver from a primary lung carcinoma. The radiologist using the system wishes to determine how similar the hepatic metastasis is to the known primary lung tumor. According to the subjective method, the radiologist would choose a training set from the known primary tumor involving the lung, and would then use a test set that consists of a plane passing through the hepatic metastasis. Presumably, areas within the hepatic metastasis that were similar to the training set in the primary lung tumor would be identified.

The problem with this approach is that the identification of the hepatic metastasis depends critically on the radiologist's selection of the training set from the primary lung tumor. If the radiologist chooses a training set that truly represents viable tumor, then the classification should be optimal. However, if the radiologist chooses a training set that contains both viable tumor and nonviable necrotic tumor, then the classification will be less accurate.

The accuracy of classification depends on how accurately the training set represents the known tissue. If an area of normal fat adjacent to a known tumor is unintentionally included in the training set, the classified image will highlight both tumor and normal fat. Likewise, if the training set contains only necrotic tumor, viable areas of tumor in the test set will not be identified.

In order to avoid the problem of subjectivity, one embodiment provides an objective analysis method, such as cluster analysis, for automatically or partially-automatically selecting a training set to represent the material or tissue of interest. Cluster analysis could be used to e.g., detect the inadvertent inclusion of two distinct tissue types within a single training set, which would alert the user to the potential problem.

Cluster analysis refers to a number of well-known mathematical techniques for objectively classifying the components of a data set into a plurality of classes based upon the relative distance between various members of the data set. In many data sets, it is found that, with respect to one or more dimensions of measurement, certain subsets of the data are, on average, closer to each other than other (possibly overlapping) subsets. Cluster analysis results in an objective assignment of all or some of the members of the data set into objectively-defined classes or clusters.

Cluster analysis thus operates on data sets which have a high degree of variation. Accordingly, a first step of performing cluster analysis is to select the data set on which the cluster analysis is to be performed. Several options are available. Cluster analysis can be applied to one or more entire fields of view or "slices". Alternatively, cluster analysis could be applied to only a portion of the slice, such as that portion of the slice which represents the body being analyzed (versus its environment). In another case, cluster analysis could be applied to a portion of a slice which is less than the entire slice of the body being analyzed. However, in this case, it is useful to include, in the cluster analysis, a relatively large region that encompasses the substance or tissue of interest. In this context, "relatively large" means that the region is likely to contain all types of substance or tissue that comprise the material of interest. As one example, if the process is to be performed for selection of a training set that constitutes a primary lung tumor, the region subjected to cluster analysis may include viable tumor, non-viable necrotic tumor and non-tumor tissue. Providing a data set that represents several tissue types permits cluster analysis to achieve a high level of distinction in the way the clusters are defined. If, in contrast, the cluster analysis is applied to a relatively homogeneous region, the cluster analysis might tend to group the data points representing the homogeneous region into clusters based on non-significant, small variations in the homogeneous tissue. Accordingly, it is preferred that cluster analysis be applied to a non-homogeneous data set, i.e., a data set which is selected to include both the material of interest and material other than that which is of interest.

Figure 10A:
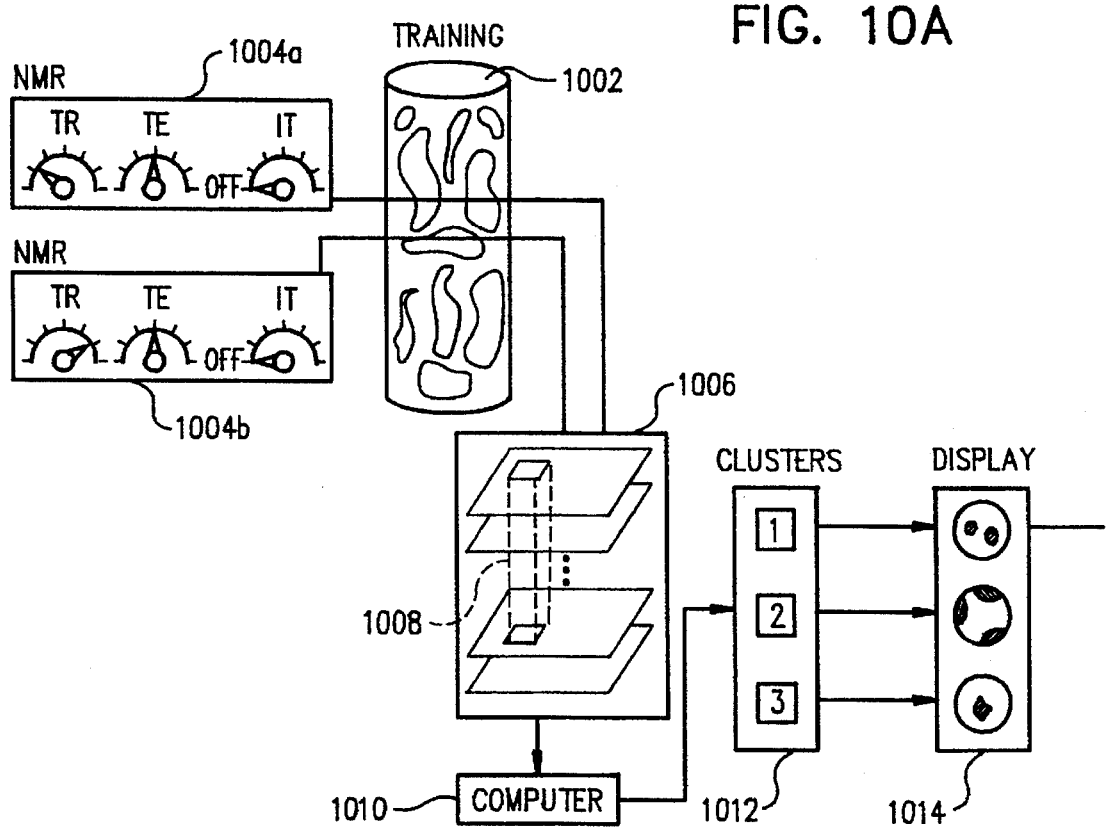
FIG. 10A–B is a schematic and block diagram of an MR process using cluster analysis.
Figure 10A:
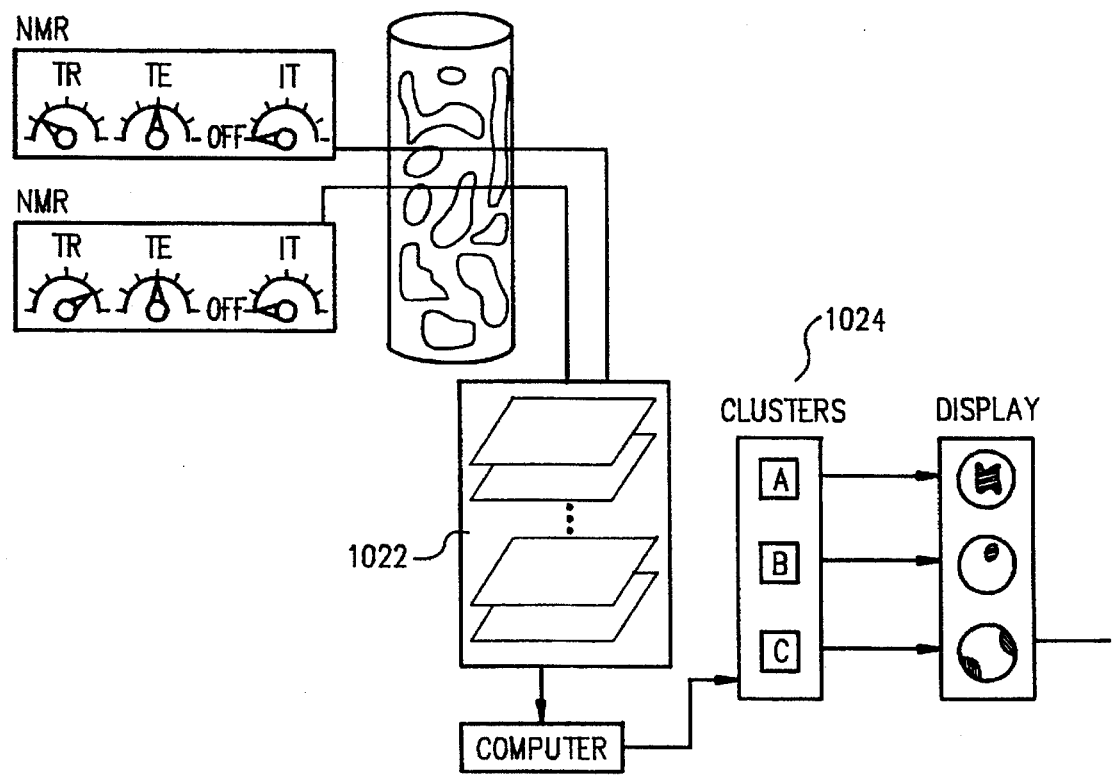
Figure 10B:
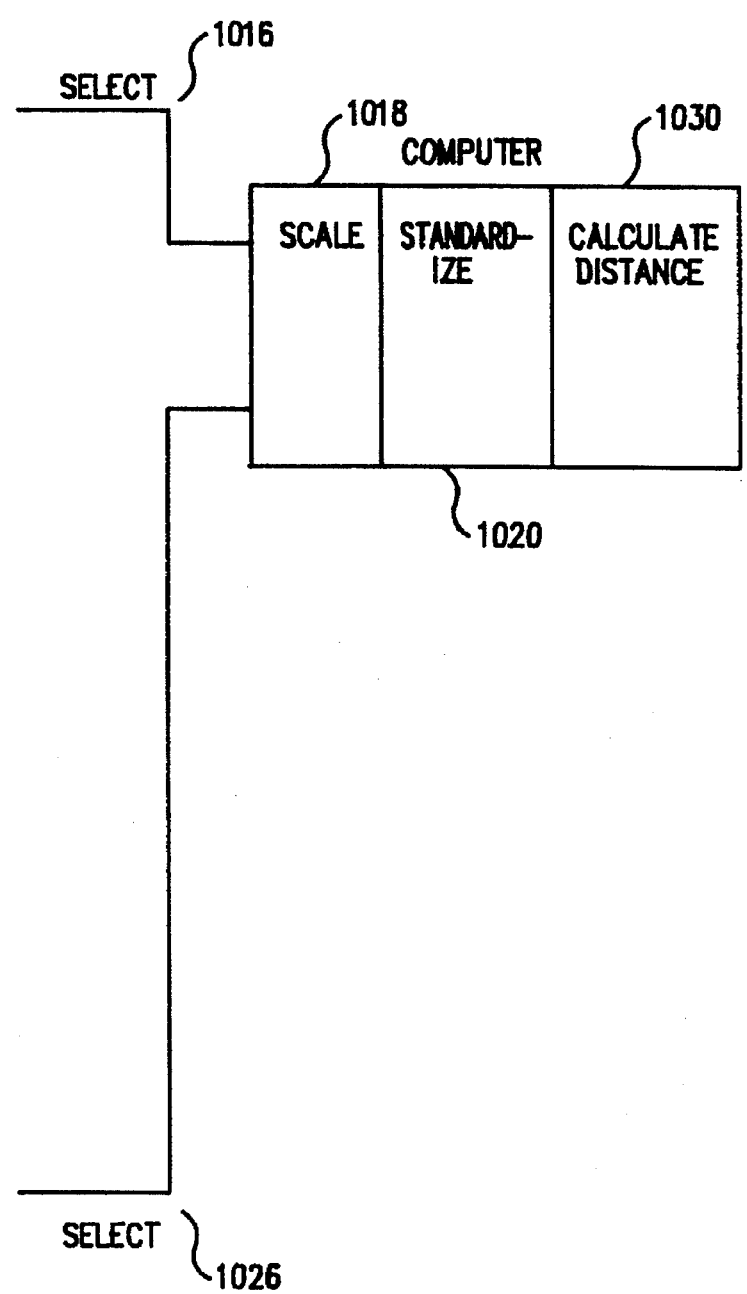

FIG. 10 depicts a process using cluster analysis according to one embodiment of the invention. As shown in FIG. 10, a body which will access the training sample 1002 is subjected to scanning by an MR device, preferably using at least two different sequences such as a $T_2$ weighted sequence 1004a and a $T_1$ weighted sequence 1004b. In the depicted embodiment, an inversion recovery 90° pulse is not used; this is represented by showing the inversion time (IT) as being turned off. These sequences are used to form a congruent set of training images 1006. The portion of the images to be subjected to cluster analysis is selected. As noted above, this can be all of the images or a portion of the images 1008 but preferably is a non-homogeneous set.

After the region to be submitted to cluster analysis is selected, the data is sent to a computer 1010, and cluster analysis is applied. Although FIGS. 10–13 depict steps performed on two or more computers, a single computer can be used, if desired. The data points in the region are classified into a plurality of different groups or clusters 1012. The training set can be selected using these clusters in several ways. First, the various clusters can be displayed 1014 for selection by a skilled observer (e.g., by color coding the display). The skilled observer could select 1016 all of one cluster or a portion of a cluster to define the training set. Selection of the training set can also be achieved objectively, e.g., by selecting one of the clusters based on other measurements (such as near-infrared and mass spectrometers).

Once the training set has been selected, the training set samples are scaled 1018 in step 86. Scaling is a conventional pattern recognition procedure in which, for example, the data intensity values are linearly adjusted such that they have zero mean value and a standard deviation of unity. The training set may also be standardized 1020 in step 86. Standardization is a technique for correcting for the drift of an MRI instrument over time, or for differences between different MRI instruments, and is further described below.

Still referring to FIG. 4, steps 90–96 perform a series of steps analogous to steps 80–86, to create a test set comprising a congruent set 1022 of e.g., 24 images of the test region of the patient's body to be scanned for secondary tumor. In step 90, a second set of congruent second images of the test region are combined. The second images are obtained using the same MRI pulse sequences, i.e., the same operator adjustable parameters, as the first images obtained in step 80. In step 92, the second images are each subject to the spatial correlation procedure described above and illustrated in FIGS. 5 and 6. In step 94, the test set is selected. This selection can be done by a skilled observer or using cluster analysis to aid in selection 1024, as described above for the training set. In many cases, the test set will be the complete second images. However, in certain cases, to save processing time, it may be desirable to specify a subregion that includes the actual target of the investigation. Finally, in step 96, the test set is scaled (and standardized) 1018, 1020 in a manner similar to that performed in step 86.

Once the training and test sets have been prepared, they are then compared to one another 1030 in step 100, in order to determine the relative "distance" between the training set and each member of the test set. A number of known statistical techniques are available for computing the distance between pairs of pixels in a multidimensional data space. For the purpose of the present invention, however, the preferred technique has been determined to be a simple Euclidian distance, computed as follows:

$$d = \left[ \sum_{i=1}^{N} (R_i - S_i)^2 \right]^{1/2} \qquad (2)$$

$R_i$ represents the ith coordinate of the training sample, $S_i$ represents the ith coordinate of the test sample, and N is the total number of dimensions (e.g., 24) in each data set. Two preferred techniques have previously been described for associating a distance value with each test set sample. In the first technique, an average training set sample is calculated, and the distance between each test set sample and the average training set sample is determined. In the second technique, for each test set sample, the distance from the test set sample to each training set sample is measured, and the minimum of these distances is selected. However, it will be understood that other measures of similarity could also be used without departing from the spirit of the present invention.

The distance measurement of Equation 2 above is an example of the so-called KNN method (K nearest neighbor) for the case of K=1. It is equivalent to the Euclidean distance between samples in a multidimensional measurement space in which each dimension corresponds to one of the images. This embodiment of the KNN technique is an example of supervised classification using a nonparametric classification algorithm. In parametric methods, there are a priori choices that must be made by the user, leading to the possibility that the classification will reflect observer bias. A potential limitation of nonparametric methods is that they cannot recognize outliers in the data. However, in many cases this limitation is overcome in practice, because the human observer will be able to consider the results of classification in the context of the entire image, i.e., the observer serves to recognize outliers.

Nevertheless, in some embodiments of the invention, parametric methods (or non-parametric methods other than the KNN method) are used for determining similarity values. An example of a parametric method that can be used is the simple independent modeling by class analogy (SIMCA) method, for example, in Mohammad A. Sharaf, et al, *Chemometrics*, pps. 242–254, 1986, incorporated herein by reference.

Computing the Euclidean distance between the average value of the samples in the training set and a given sample in the test set is computationally fast, but has the disadvantages of requiring selection of a sample out of the test set and of providing little information about the heterogeneity of the training set. Tissue heterogeneity is more accurately expressed by measuring the distance between each sample of the training set and a given sample in the test set, and selecting the smallest distance as the representative distance. The minimum distance measured in this way represents the sample in the training set that is most similar to the sample in the test set.

Once cluster analysis is performed, the results of the cluster analysis can be used for analyzing similarities in a number of ways. If, in the example above, a clinician wishes to know how similar the viable tumor in the lung lesion is to the viable tumor in the hepatic metastasis, cluster analysis can be performed in the following way to give a numerical estimate of similarity. A skilled observer would choose a relatively large region from the lung tumor and would choose a relatively large region from the hepatic metastasis. Cluster analysis would then be independently applied 1012, 1024 to each of these regions.

For the sake of this example, let us suppose that each of the two lesions yields three clusters 1012, 1024. The results of cluster analysis could be used in at least two ways.

In the first method, illustrated in FIG. 10, each of the three clusters for the lung lesion could be used to classify the entire lung lesion, and a trained observer would then look at the three classified images and choose 1016 the one image that the observer felt was most likely to represent viable tumor. This process could be repeated for the liver lesion, and the chosen regions 1026 in the liver and lung could then be compared numerically to determine the degree of similarity, using, e.g., the euclidean distance 1030 or other techniques described above.

Figure 11A:
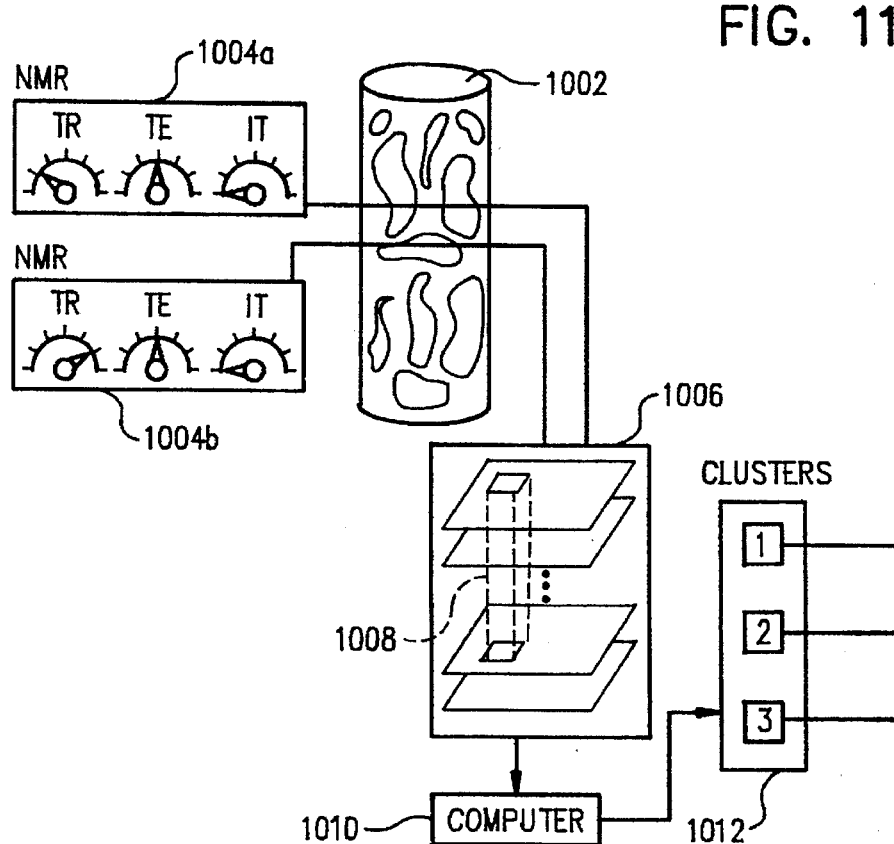
FIG. 11A–B is a schematic and block diagram similar to FIG. 10, but showing comparison prior to display.
Figure 11A:
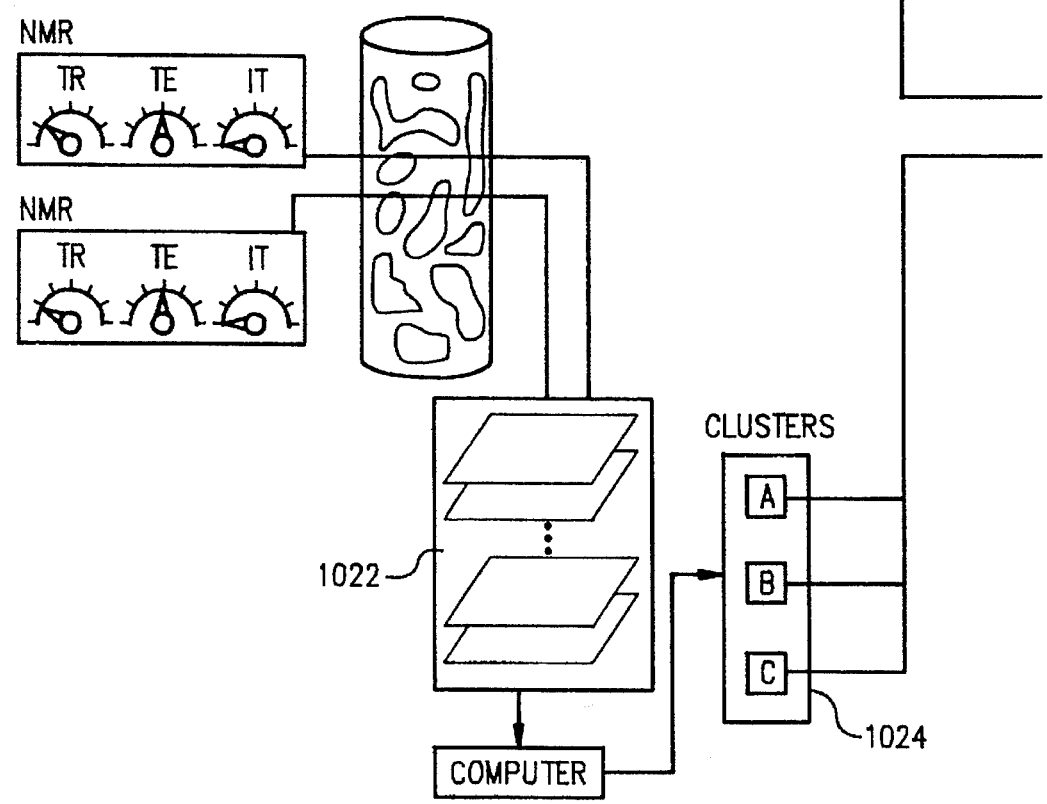
Figure 11B:
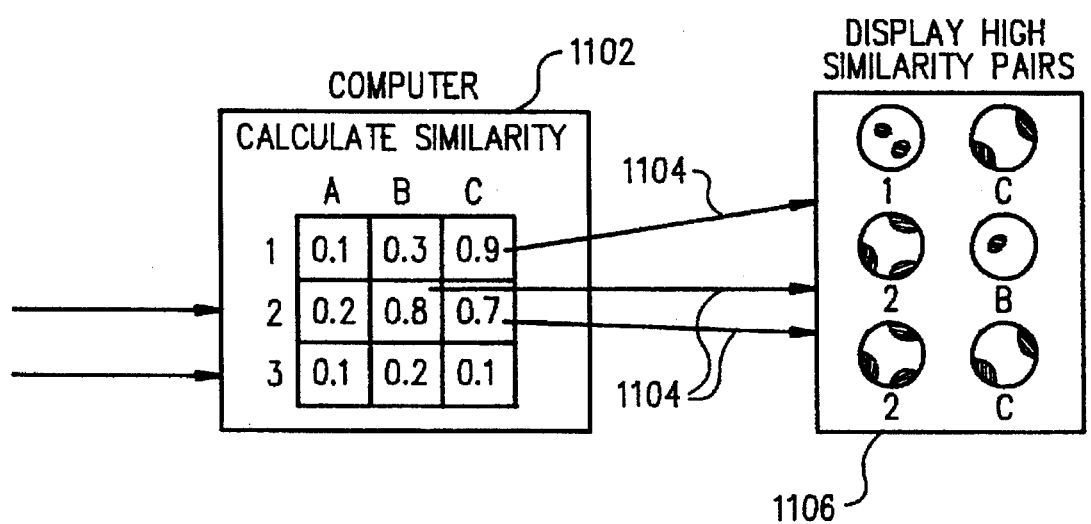

Alternatively, and more objectively, as depicted in FIG. 11, the three classes identified in the liver and lung lesions could be arranged into a 3×3 matrix, and the similarities (distances) between each pair of clusters 1102 could be determined. The pairs of clusters having the shortest distances could then be identified 1104, and these pairs of clusters could then be indicated with a false-color overlay on the images of the lung lesion and the hepatic lesion 1106. The purpose of doing this identification would be to determine which of the pairs was most likely to represent similar, viable tumor.

The accuracy of the pattern recognition technique of the present invention depends on the discriminating variances of the training and test sets; the greater the discriminating variance of the data, the greater the likelihood that two different tissue types will be distinguished. The discriminating variance can be increased by increasing the number of different pulse sequences (images) applied to the region of interest. In theory, the accuracy of classification can be made arbitrarily high by increasing the number of sequences used. In practice, the need for greater accuracy must be balanced by the requirement that the data not be excessively overdetermined, and by practical limits on imaging time. Using excessively overdetermined data reduces the ability of the classification to generalize the properties of the training act to identify similar, but not identical, samples; using undetermined data for classification will lead to a large degree of nonspecific identification.

In a medical application, it is believed that high classification accuracy is reached using relatively low spatial resolution for the ME-6 pulse sequence, which helps decrease the total imaging time. Using this sequence with a 64×256 pixel array (phase, frequency) leads to greater classification accuracy than an array having a higher spatial resolution (128×256), because decreasing the spatial resolution increases the pixel size, which improves the signal-to-noise ratio. This amounts to trading spatial resolution to gain greater spectral resolution, which represents greater information content per pixel. This departs from the traditional approach in MRI, which strives above all else to achieve high spatial resolution. As hardware and software have improved, it has become possible to increase spatial resolution without sacrificing overall information content to an unacceptable degree.

The degree of tissue discrimination achieved by the invention depends on the percentage of nearest distances that are highlighted. Highlighting a very small percentage (e.g., 0.2% to 2% of the test samples) results in high discrimination, but lowers the sensitivity for detecting unsuspected lesions. Highlighting a larger percentage (2% to 8%) will decrease the degree of tissue discrimination, but will increase the likelihood of detecting unsuspected lesions. If the principal purpose of using MRI is to characterize a recognized lesion of unknown origin rather than to detect unsuspected lesions, then it is generally preferable to highlight only the nearest 0.5% to 2% of the pixels in the test image, to maximize tissue discrimination.

In carrying out the present invention, the data should preferably be adequately overdetermined, such that the ratio of the number of samples to the number of variables describing each sample is at least three. Each sample that represents the combined ME-6, STIR, and $T_1$-weighted sequences consists of 8 original data and 16 derived data that represent spatial correlation variables. A training set that contains 24 or more samples will result in a system that is adequately overdetermined with respect to the original 8 data acquired for each sample.

Even though it is theoretically important to have the system adequately overdetermined to avoid spurious correlations (i.e., those that arise by chance), we have found that the number of samples included in the training set has surprisingly little effect on the accuracy of classification. Although a training set with 4 samples is relatively undetermined, it can result in classification that is similar to the classification achieved by a training set consisting of 25 to 50 samples. At the other extreme, a training set containing 700 samples decreased the amount of nonspecific highlighting compared to a 25-sample training set. However, the 700 sample set required about 25 times more computer time than the 25 sample set. In general, we find that a training set size of 16 to 25 samples balances the classification accuracy and computational burden.

The additional imaging time required will depend on the operator's approach. For example, in medical applications, if radiologists rely on combinations of $T_1$-weighted and $T_2$-weighted images for evaluation of body and CNS metastases, the time required to obtain one or more STIR sequences and multiple spin-echo sequences may be impractical. However, because much body and spinal oncology imaging is accomplished with a combination of STIR and $T_1$-weighted spin-echo sequences, acquiring a multiple-echo spin-echo sequence at two selected anatomic sections adds less than seven minutes to the overall imaging time, when a relatively low spatial resolution is used for the ME-6 pulse sequence.

A similarity image also has value in its own right. An example of this is the creation of a similarity image where the pixel brightness is proportional to the similarity of the pixel to the silicone gel found in some types of breast implants.

An example of tissue (or substance) specific imaging would be where a physician wishes to determine whether or not leakage has occurred from a silicone breast implant. It may be known, e.g., that a fluid collection may represent a collection of non-silicone-containing fluid that arises following surgery, or a collection of silicone that has leaked from the breast implant.

To distinguish between these possibilities, a similarity image could be created using a training set taken from the center of the silicone-containing breast implant. The resulting similarity image would then display pixels most similar to silicone brightest, and those pixels least similar to silicone with the lowest signal intensity. If the fluid external to the prosthesis capsule was bright, then it would be presumed similar to the silicone in the breast implant, and one could conclude that leakage had occurred. If the fluid was relatively dark, then one would lean toward the collection being a non-silicone-containing postoperative or inflammatory collection.

Much of the discussion above has concentrated on problems of classifying materials or tissues, i.e., determining whether a material or tissue of interest is or is not of a predetermined type (e.g., is a tissue from a lesion similar to a primary tumor; is a tissue of interest, tumor tissue, cyst tissue, or fat tissue; is an unknown oil, high viscosity oil or low viscosity oil). An embodiment of the present invention can also be used to estimate or predict the value of a continuous variable as opposed to categorizing a tissue or substance into a finite number of discrete classes. For example, the present invention can be used to estimate or predict the concentration of a substance, the viscosity of a material and the like. Furthermore, the present invention can be used to evaluate (either into discrete classes or by assignment of a value along a continuum) characteristics of materials which may have complex physiochemical characteristics that may not have a well-defined measurement scale (such as smoothness, creaminess, greasiness).

Figure 12B:
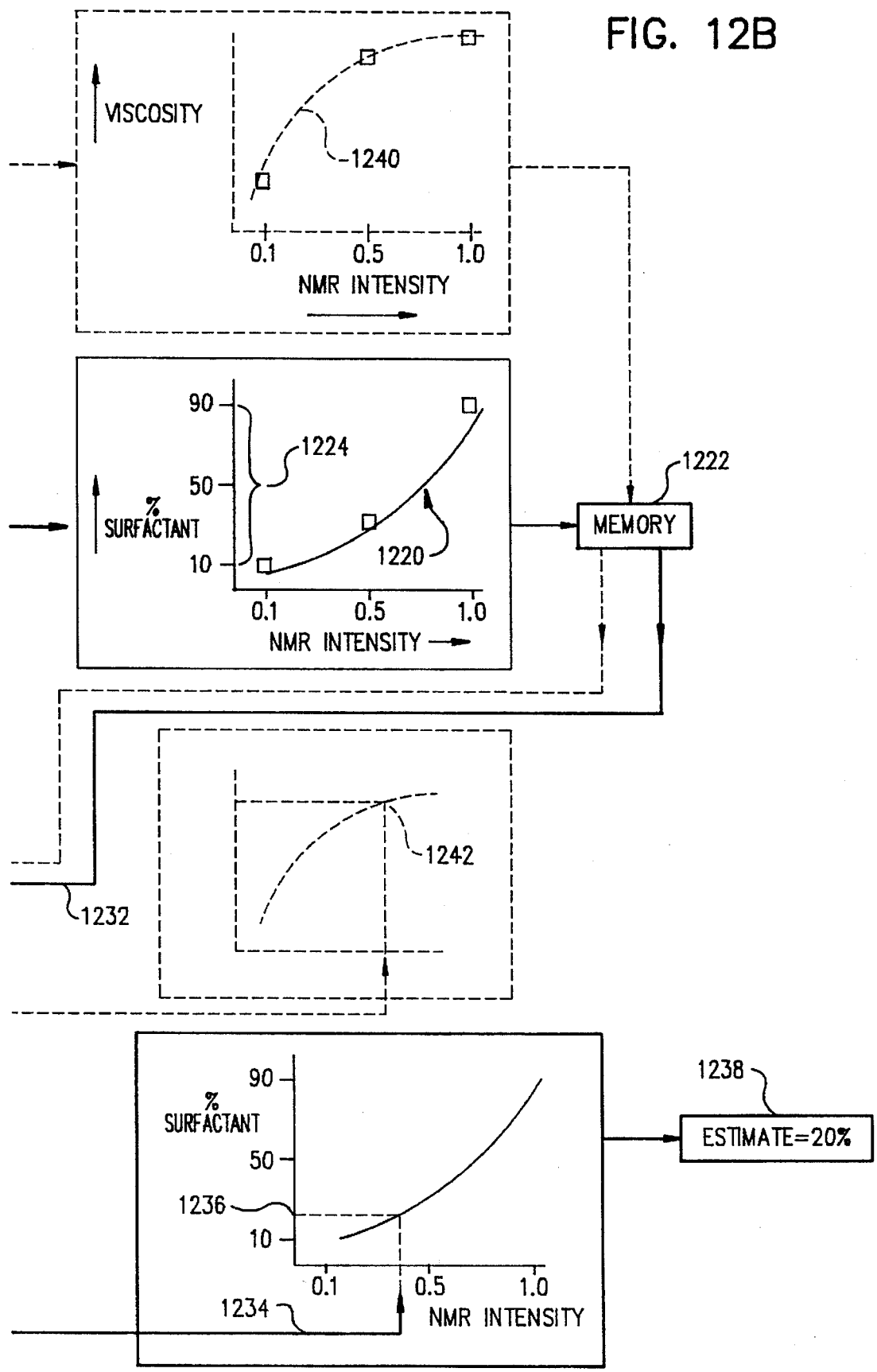
Figure 13A:
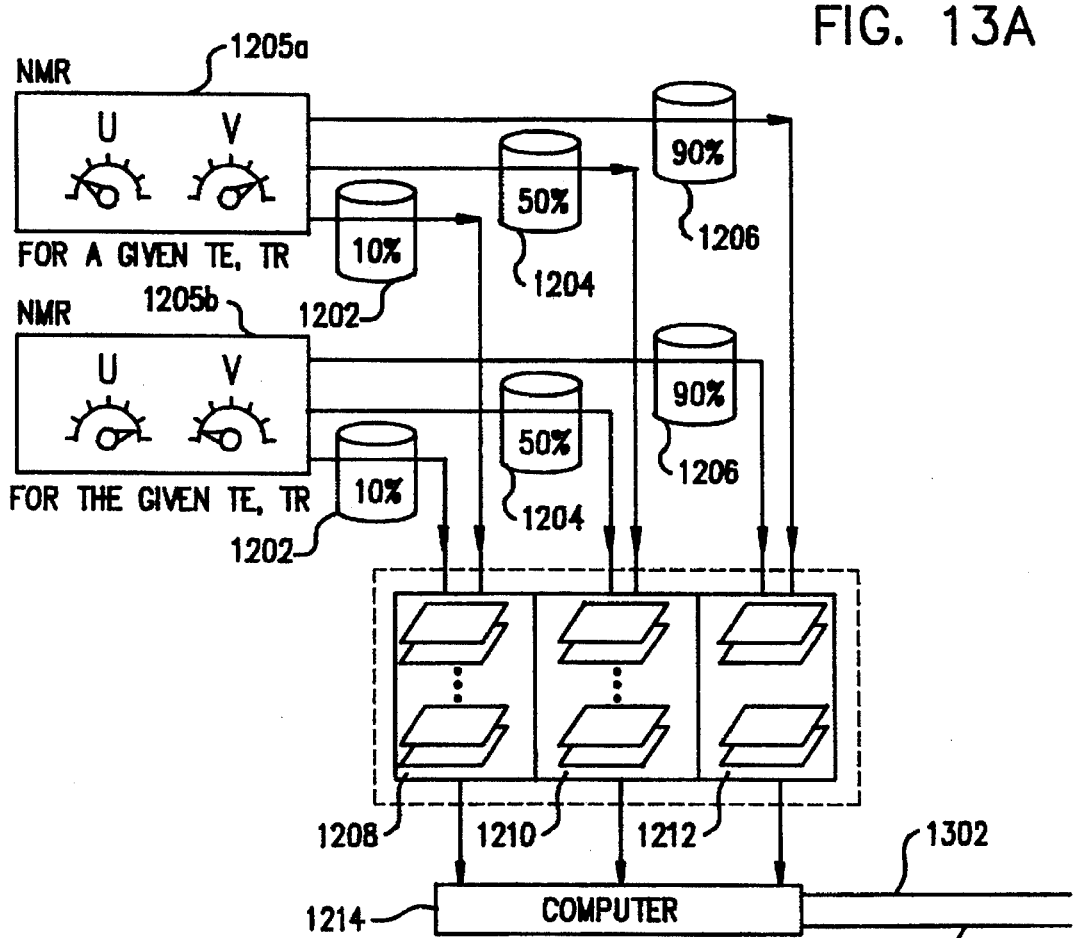
FIG. 13A–B is a schematic and block diagram of an MR process similar to that of FIG. 12, but using higher-order methods.
Figure 13A:
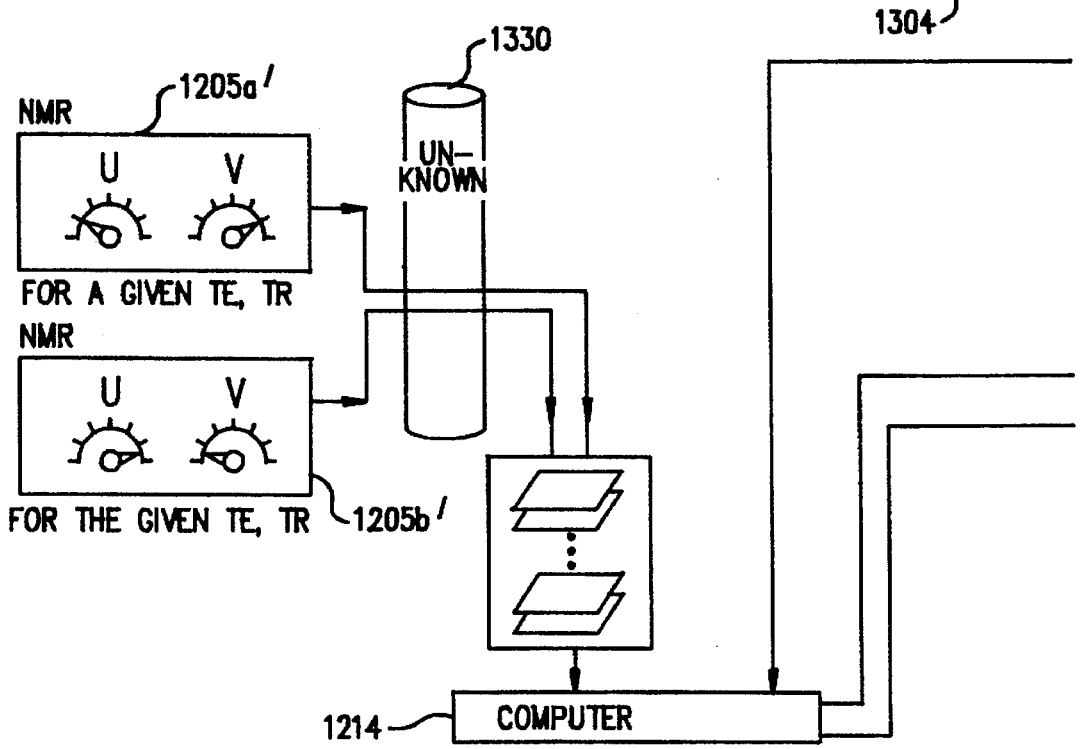
Figure 13B:
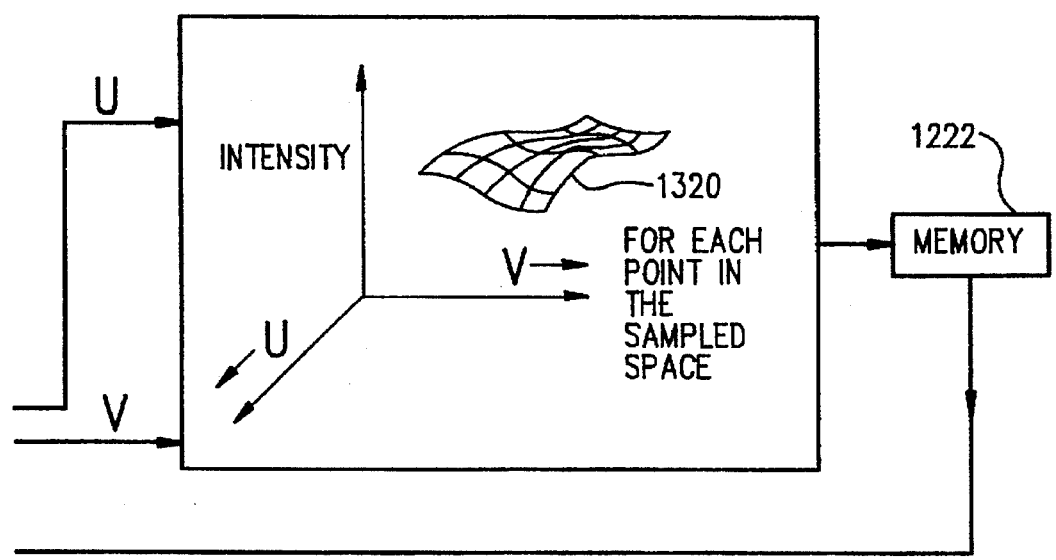
Figure 13B:
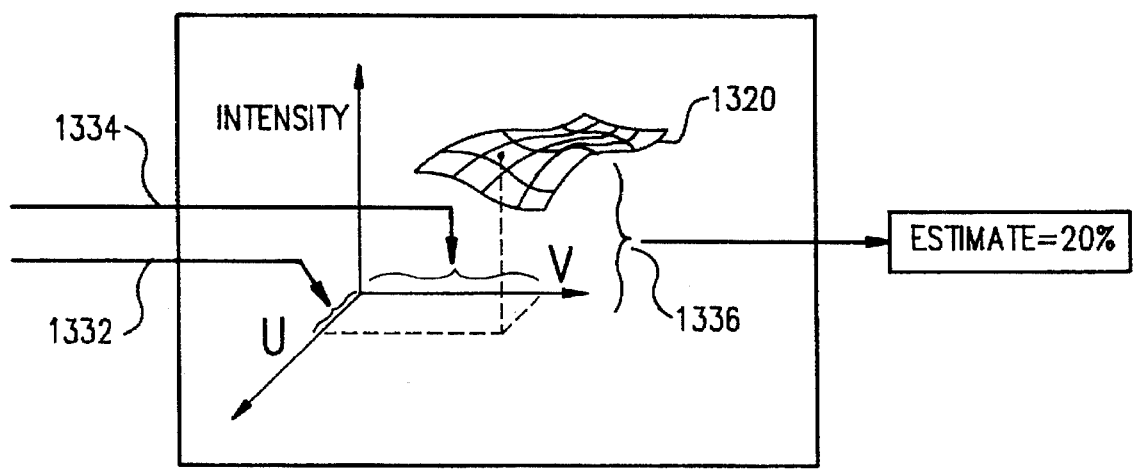

Two general approaches for the prediction of continuous properties based on MRI signatures can be used, generally described as first order methods and higher-order methods. First order methods generally involve forming a calibration curve based on a series of samples that have a known, varying characteristic, such as a varying concentration of a substance of interest. FIG. 12 depicts, schematically, a first order method. As shown in FIG. 12, multiple samples having various values of a characteristic of interest 1202, 1204, 1206 are each subjected to an MR analysis using a certain set of sequences 1005a, 1005b. As an example, the calibration samples, 1202, 1204, 1206 may be a series of gels containing a surfactant whose concentration is known to be 10% in sample 1202, 50% in sample 1204, and 90% in sample 1206. For each of the samples, the output from the MR device is used to form a congruent image, select a training set, and standardize the training set, if necessary, as described above. The result is three standardized training sets 1208, 1210, 1212. Each training set is paired with the corresponding surfactant concentration and the pairs of values are analyzed by a computer-implemented 1214 analysis method which is suitable for continuous property prediction. Examples of suitable methods include partial-least squares (PLS), principal components regression (PCR), locally weighted regression (LWR), projection pursuit regression (PPR), alternating conditional expectations (ACE), multivariate adaptive regression splines (MARS), and neural networks (NN), as described, for example in S. Sekulic, et al., "Non-Linear Multivariate Calibration Methods in Analytical Chemistry," *Analytical Chemistry*, 65:(19) 835A–845A, Oct. 1, 1993, incorporated herein by reference. The output of these techniques is a prediction model or mapping 1220. The mapping maps a first set of values, such as values representing MR measurements to a second set of values such as values representing, in the present example, the concentration of the surfactant. The mapping is continuous over at least one domain 1224 of the second set of values. In a typical situation, the MR signature can involve multiple dimensions (such as mean and standard deviation values for each of a plurality of MR sequences). For purposes of providing a simplified illustration, the x-axis of the model 1220 depicted in FIG. 12 represents average intensity for a $T_1$ weighted MR measurement normalized to a scale of 0.1 to 1.0. In the example depicted in FIG. 12, the model 1220 is the result of a curve-fitting procedure applied to the three pairs of data "points" 1222, 1224, 1226. For the sake of simplicity, FIG. 12 depicts the model as a cartesian graph. In fact, the model can be characterized and stored in memory 1222, as a plurality of numbers, e.g. a slope and intercept for a linear model, or a series of coefficients for a non-linear model.

After the model is defined, the next step is to obtain an MR response function of a material of unknown characteristics or identity 1230. In the present example, this may be a gel with an unknown concentration of surfactant. The MR response function is generated using the same set of sequences 1205a', 1205b' that were used to create the model 1020. The MR signature may be standardized, as described herein, as necessary. The calibration model 1020 is recalled 1232 from computer memory 1222 and used to estimate the unknown concentration of surfactant based on the MR measurements of the unknown 1230. In the simplified example, assuming the MR measurements of the unknown 1030 yielded an average of $T_1$ weighted intensity of 0.3 1234, the model 1220 predicts a surfactant concentration of about 20% 1236 which is then output or stored 1238.

Multivariate techniques for predicting continuous properties (such as PLS and PCR) can be used to predict values of multiple variables simultaneously for a given sample. For example, as shown in FIG. 12, multivariate techniques can be applied to the same set of data 1008, 1010, 1012 to yield a second model 1240. As one example, model 1240 may be a prediction of the viscosity of the gel. Thus, the same MR measurements may be used to estimate or predict 1242 both surfactant concentration and viscosity.

There are occasions when one wishes to predict a continuous variable, but one does not have a set of calibration standards for which the property of interest varies in a known way, and when the composition of the sample is also unknown. For this type of problem in continuous property prediction, second order (or higher-order) techniques can be applied, as illustrated in FIG. 13.

The methods that are used to accomplish second order calibration include rank annihilation (RA) as described, e.g., in B. Wilson, "An Improved Algorithm for the Generalized Rank Annihilation Method," *Journal of Chemometrics*, Vol. 3, pages 493–498, incorporated herein by reference, and bootstrap techniques such as Bootstrap error-adjusted single-sample technique (BEST). As described, e.g., in "Making your BEST case," *Analytical Chemistry*, Vol. 65, No. 9, incorporated by reference. An important difference between second order (RA, BEST) and first order (PLS, PCR) methods is that the second order methods require input data that are a function of two independent variables U and V in contrast to first order methods, which require that the input data is a function of a single independent variable.

To access a continuous property of a substance using a second order calibration method, one would obtain MRI signatures of samples using sequences of two independent variables, U and V, where U and V are stepped through a range of values. Typically, U and V values will be stepped-through for each of a plurality of points within the body being subjected to analysis. For example, U and V 1302, 1304 might each be sampled at eight different values at each point, which would characterize the substance by a square matrix of 64 intensities at each point. This 8×8 matrix would serve as input to the second order calibration methods. The result of this second order calibration method is a second order mapping 1320. This is depicted in FIG. 13 as a two-dimensional surface. In general, one such surface will be generated for each point in three-dimensional space sampled by the device. After the second order mapping 1320 is constructed and, preferably stored in computer memory 1222, a continuous property of an unknown 1330, is predicted by subjecting the unknown 1330 to the same MR sequences 1205a', 1205b' used to generate the model 1320. The two independent variables U and v 1332, 1334 that result from this MR measurement are applied to the model 1320 to predict an estimated value 1336 of a property of the unknown 1330.

A number of variables can be used as U and V. An example is provided by the correlation spectroscopy ("COSY") technique, described in e.g., J. W. Akitt, *NMR and Chemistry*, pps. 207–215:1992, which is typically performed in the frequency domain and yields a 2-D spectrum whereas the present technique will typically yield a n-D graph of intensities (2-D in the illustrated embodiment).

Quantitative methods can be applied to medicine as well as industry. For example, a first order technique could be used to measure the concentration of fat or iron within the liver, oxygen tension within a region of radiated tumor, or cellularity of the bone marrow. A second order calibration method could be used to measure the concentration of a biological substance in the presence of unknown interfering contaminants. It should be recognized that prediction of continuous properties can be made for properties that are themselves poorly defined, such as "degree of radiation-induced tissue damage, degree of ischemia, degree of response to therapy."

When a second order calibration method is used, it is preferable also to use a second-order standardization method as described, e.g., in Eugenio Sanchez, et al., "Tensorial Calibration," *Journal of Chemometrics*, Vol. 2, pages 265–280, 1988 and Yongdong Wang, et al., "Standardization of Second-Order Instruments," *Analytical Chemistry*, Vol. 65, pages 1174–1180, 1993, both incorporated by reference.

The signatures of biological tissues or inert substances can be collected together to form a library of signatures. The concept of a library would allow signatures of related conditions to be grouped together into a diagnostic package. For example, consider a patient who has undergone mastectomy for breast cancer and is thought to be cured. A number of years after the mastectomy, the patient develops abdominal pain, and an ultrasound examination of the abdomen shows a 2 cm liver lesion. Because the primary tumor was removed at the time of the mastectomy, the primary tumor is not available for generating a MRI signature. In this circumstance, a MRI response function of the patient's liver lesion likely obtained with the assistance of cluster analysis, would be compared to a library of known liver lesions to determine what the most likely possibility would be. In one example, the library would likely contain perhaps 100 standardized signatures of metastatic breast cancer, 100 standardized signatures of benign hepatic hemangiomas, 100 standardized signatures of abscess, and so on.

The same approach could be taken with diffuse abnormalities of the liver or other organs and with industrial analytical problems, process control and biotechnology.

A number of algorithms can be used to effect comparison; including SIMCA (Simple Independent Modelling by Class Analogy), and K-nearest neighbor.

The MR signature response function consists of a collection of variables that describe how a substance responds to a given set of applied pulse sequences. As we have discussed, the MR response function can be used for predicting class membership or for predicting continuous properties. It is possible to combine the MRI signature of a substance with other non-MRI measurements that characterize the substance; to form an expanded signature. In the setting of a library for diagnosing hepatic disorders, an expanded signature might consist of the MRI signature of the patient's liver tissue and variables that describe various biochemical tests made on the patient's blood, such as serum bilirubin, amino transferase, and so on.

The expanded signature could then be used to improve on the diagnostic specificity of the conventional MRI signature. The same principles of the expanded signature can be applied in biotechnology and industry. It should be recognized that a given library for medicine or industry could contain both MRI signatures and expanded signatures; if unknown samples were characterized by only their MRI signatures, then only the MRI portion of the expanded signature would be used. It is possible to use only part of the expanded signature, because the signature consists of a number of variables whose identity and origin is known, and so it is possible to distinguish variables representing the MRI signature from variables that reflect measurements of non-MRI properties.

The properties of MR imaging allow an instrument to acquire numerous contiguous slices simultaneously to characterize a volume of tissue or other substance. For example, in the context of class recognition techniques it is possible to determine the number of pixels in an image that are similar to a chosen training set (assuming a given level of confidence or a threshold for determining class membership). Each pixel corresponds to a known volume ("voxel"), which is defined by the slice thickness and the spatial resolution of the slice. The volume of tissue in the slice that is similar to the training set is determined by multiplying the number of voxels similar to the training set by the volume of the voxels. This process can be repeated automatically for continuous slices within the imaged volume, and a 3-dimensional estimate of volume of a targeted substance can be obtained. As an example, the targeted substance may be the volume of viable tumor in a hepatic metastasis, the amount of grey matter in the spinal cord, or the volume of a chosen substance within an inhomogeneous mixture (for example, the volume of chocolate sauce in ½ gallon of marble ice cream).

The most accurate classification occurs when the test and training sets are both acquired in parallel planes; namely, if the training set is acquired in the coronal plane, the test set should be acquired in the coronal plane. The training and test sets should be acquired in parallel planes because the pixels in a given image are not isotropic. When the training and test sets are acquired at different times, as shown in FIG. 3C, then the standardization technique described below should be used, to minimize effects caused by instrumental drift. In all cases, the corresponding sequences used to produce the training and test sets should be acquired using identical instrument parameters: identical phase-encoding direction, slice thickness, field of view, averages, STIR inversion time, and TR. Preferably, the training and test sets should be acquired on the same instrument. However, if they are acquired on different instruments, standardization techniques can be used to minimize the effects of different instrument responses, as described.

Incorrect identification of pixels in the test set can occur under at least two circumstances: first, when the discriminating variance of the data is insufficient to enable a classification method to distinguish between, e.g., tumor and an unrelated tissue; second, when there is a violation of the basic assumption that the MR signatures of tissues depend only on type of tissue and not on the location of the tissue within the imaged plane. Conditions that violate this assumption are: motion artifact along the direction of the phase-encoding gradient; inhomogeneity of the gradients; poorly-shaped radio frequency pulses; and truncation artifact and chemical shift artifact occurring at the boundary between tissues that have substantial difference in their MR signal intensity, such as at the border between solid organs and mesenteric fat.

In evaluating the accuracy of the method, it is important to distinguish between the diagnostic questions which the method has the potential to solve, and those questions that the method is incapable of solving. One embodiment of the invention measures the similarity between different tissues, but generally cannot characterize a tissue as benign or malignant, or as infected or sterile. The user is obligated to apply the invention in a clinically valid way, because the procedure will generate a matrix of distances from any combination of training set and test set. The method is meant to complement, not replace, percutaneous biopsy.

As previously described in connection with FIG. 3C, in one application, the present invention produces the training and test sets from images formed at different times. However, when the training and test set samples are produced at different times, it is possible that drift in the response of the MRI instrument could produce differences between the training and test samples that would influence the results of the present method. In addition, in certain cases, it may be necessary to acquire the training and test samples using different MRI instruments. In this case, differences between the response of the two instruments could affect the distances between samples in a way not related to the similarity of the underlying tissue.

To eliminate or at least minimize these effects, multivariate instrument standardization techniques are preferably used to limit errors due to instrument variation. Suitable techniques are described in the article by Wang, Veltkamp and Kowalski, "Multivariate Instrument Standardization," *Analytical Chemistry*, 63:2750–56, hereby incorporated by reference. Of the techniques described by Wang et al., the preferred technique is the "direct" technique (including the piecewise direct) in which the samples produced during one imaging session are corrected to produce estimates of the samples that would have been produced during the other imaging session. Because there will typically be more test samples than training samples, it may be preferable in terms of computer time to correct the training samples, which will typically be acquired during the first imaging session, to produce estimates of the target samples that would have been produced at the second imaging session, when the test samples were acquired.

Standardization is performed by including a plurality of reference objects in the MR imaging apparatus during each imaging session. This can be accomplished by positioning reference objects such that some pixels representing the reference objects appear in each image. Alternately, the calibration standards could be separately imaged on a periodic basis (e.g., once a day), and used to standardize all images acquired during that day. For the purpose of the present invention, suitable calibration standards include water, 1 mM (millimolar) $CuSO_4(aq)$, 1:1(v:v) acetone:water, safflower oil, mineral oil, saturated sucrose solution, 95% ethyl alcohol, glycerin. However, other reference objects can also be used. To produce accurate results, identical reference objects are used during acquisition of both the training and test sets, and the calibration standards must not have undergone substantial variation or degradation with time. In one embodiment, the number of reference objects is equal to the number of independently obtained images.

In one embodiment the data is standardized before the data has been reconstructed to form an image. In another embodiment, standardization is applied after the acquired data have been reconstructed to form an image.

A problem with magnetic resonance imaging is that the magnetic field within the MR imager is not perfectly uniform, yet the algorithms used to reconstruct the MR data into images assume that the field is uniform. This discrepancy creates areas of the images that have either greater or less signal intensity than they would if the magnetic field were perfectly uniform.

According to one embodiment, the data is corrected for the field inhomogeneities. This embodiment requires that certain variables be known in advance before imaging is performed; namely, the field of view, the sequence, and the spatial location of the plane imaged. For purposes of this disclosure, consider a single sequence applied to a single slice. (It is understood that this technique can be generalized to multiple slices and multiple sequences).

Correcting the field begins by placing a uniform reference material, such as a water-filled cylindrical phantom, within the magnet bore. The phantom provides a uniform substance so that the intensity of the pixels in a slice through the phantom should be equal if the field is uniform. A suitable section is taken through the phantom at the specified geometric location using the specified sequence. The average value of the pixels in the resulting image is determined. This data is then used as a basis for correcting the field inhomogeneity. In one embodiment, the average value of the pixel intensity is divided by the intensity of each pixel of the image. For a pixel whose original intensity is less than that of the average, its ratio will be greater than 1. For a pixel whose original value is greater than the average value, its ratio will be less than 1. This process creates a correction matrix of ratios that will be used to correct subsequent images that are acquired at that particular geometric location using that particular sequence and field-of-view.

Each pixel within the patient or nonmedical image is multiplied by the corresponding ratio from the field-correction matrix and stored as a new corrected value. At the conclusion of the process the image has been corrected for the known inhomogeneities in the applied field. It is this corrected image that would then be used as input for MRI analysis or for conventional radiological interpretation.

Because the field inhomogeneity represents a generally fixed property of a given magnet and its gradient coils, once the field-correction matrix is acquired, it preferably can be used numerous times in the future, without the need for, e.g., daily or weekly re-acquisition. In practice, the user would acquire a phantom for each commonly-used sequence at the typical fields of view and store the resulting field-correction matrices in a workstation or within the imager itself for automatic correction of patient or nonmedical data.

Figure 14:
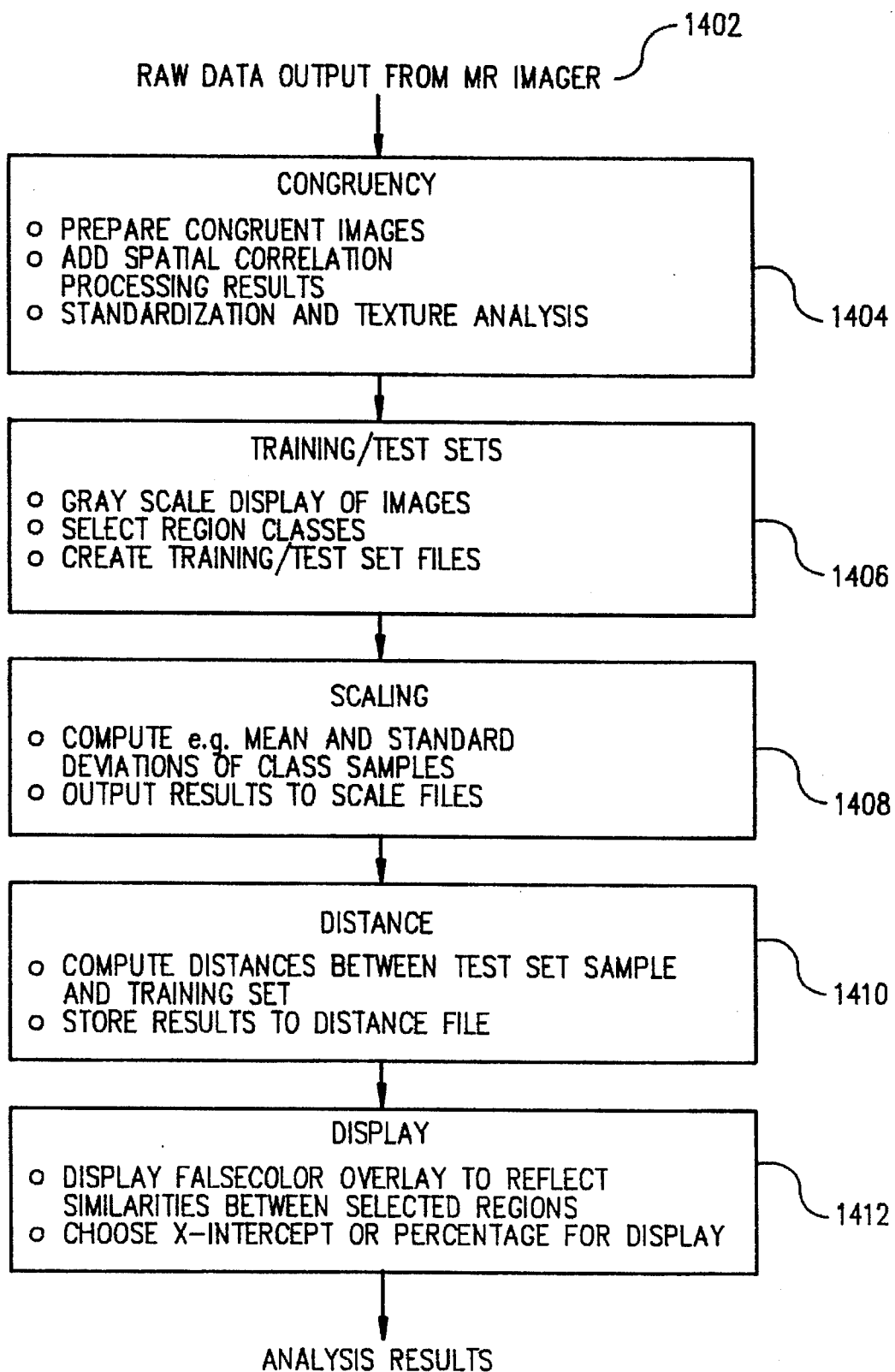
FIG. 14 is a block flow diagram of a software-implemented process according to one embodiment.

A number of approaches can be used for implementing the described procedures in software. FIG. 14 displays one approach in which an embodiment of the invention is implemented using five software modules, indicated as congruency 1404, training/test sets 1406, scaling 1408, distance 1410 and display 1412.

The "congruency" module prepares a set of congruent images (slices) that will be used to create training set and test set files. Each slice is obtained by using different MRI pulse sequences and comprises a two dimensional rectangular array of pixels. (E.g., a rectangular array of dimension MDR×MDC where MDR=256, and MDC–256). Each pixel is represented by a 12 bit non-negative (unsigned) integer. In addition to the original congruent slices, the congruency module 1404 also allows the user the options to apply standardization and texture analysis techniques such as, spatial correlation processing, to each pixel in the slices. Options includes adding images of the averages of the first nearest neighboring pixels (8), next nearest neighbors (16), and the next nearest neighbors (24), or other textures analysis techniques.

The "training/test sets" module 1406 displays slices in a gray scale to adequately show the regions of interest (e.g., primary tumor). The module reads in data files (congruent image files) that were prepared by the congruency module 1404. It then prompts the user to select which slice to display and the base and roof values of pixel intensity for the gray scale display. The gray scale is a color map of 256 colors with the lowest index displays as black and the highest white. Any pixel in the selected slice that has intensity less than the base will be displayed as black and any pixel with intensity greater than the roof will be displayed as white. The scheme for providing a gray scale plot can be expressed as:

$$pixel\_color = 255 \text{ if pixel\_intensity} > roof;$$
$$255*(pixel\_intensity-base)/(roof-base);$$
$$0 \text{ if pixel\_intensity} < base;$$

The next step is to select training set (test set) classes. A training set class is essentially a region of samples within the set of congruent images. There are many ways to select training set (test set) classes. The module displays a variable-sized "rubber band" box over the region of user's consideration. Once a region is selected, the user will be asked to enter a class number (integer). This class number will be used to identify different selected regions (boxes). It is acceptable to use a single class number to identify multiple selected regions (boxes). That is to say, a class can contain samples in different selected boxes. After the user has finished selecting the desired regions, the module stores the resulting regions to a file (training/test set file). This output file contains information that records the position of each sample in every selected class of the congruent images. These files will be used to calculate means and standard deviations of samples and to compute distances.

The "scaling" module 1408 can use any of a variety of scaling procedures, the scaling module is used to calculate the mean and standard deviation of samples in a training/test set class which will then be used to autoscale samples in any training/test set class of interest. In addition to computing the mean and standard deviation of one training/test set class in a training/test set file, this module also calculates the mean and standard deviation of samples in:

1. Combinations of multiple classes in one training/test set file
2. Combinations of multiple classes in more than one training/test set file.

The module allows the user the option to standardize training/test set class samples before computing the mean and standard deviation. It stores the results in scale files that will be used to autoscale samples.

The "distance" module 1410 computes the "distance" between a training set class and each member of the test set class. The program prompts the user to submit training set file and test set file. It then asks the user to choose the training set class and the test set class in each file that will be used for computing distances. The user is given the option to standardize the training set data. User can also choose the value of K in the KNN pattern precognition method. Next, the module prompts the user to submit scale files (created by the "scaling" module) that will be used to autoscale the training set and the test scale set classes. The same scale file can be used to autoscale both classes. Once the training set and test set class are autoscaled, this module computes the distance between each pixel in the test set class and the whole training set class. Each distance is a double precision floating point number. Distances will be stored in a distance file. The output distance file records computed distances of each test set class sample. It also provides information of the maximum and minimum, mean and standard deviation of the computed distances.

The "display" module 1412 is used to display similarities between samples in test set class and training set classes. This is done by superimposing a falsecolor color display of the computed distances onto a gray scale plot of an appropriate image (slice). The program reads in an appropriate data file of congruent images (slices) and a distance file that was created by the "distance" module. The user will be asked to select which one of the slices to display, the base and roof values of the gray scale plot, and the method of falsecolor display. This module only displays falsecolor images of pixels in the test set class. Any pixel outside of the test set class will be displayed as black.

Two methods can be used to display falsecolor color image:
1. Select percentage of pixels in the test set class to display. Also allow user the option to select a threshold value in order to consider only those pixels in the test set class that have distances less than the threshold value.
2. Select x-intercept of the linear interpolation line of color scale (see FIG. 8). Any pixels with distances greater than the x-intercept will be displayed as black.

Pixels can be displayed with the scaled color intensity or with the highest intensity. That is, 256 in a 1–256 falsecolor scale). In one embodiment, yellow, green, blue, and gray scale color scales are used.

This embodiment allows different options of display:
1. Single image: one distance file, one data file of congruent images, select either percentage of x-intercept
2. Two images:
    1. One distance file, one data file of congruent images, and combinations of x-intercepts/percentages
    2. Same as 1 with two distances file
    3. Same as 1 with two distances files and two data files.

Fat subtraction is accomplished in this module by:
1. Use a gray scale as the falsecolor scale
2. Select the lowest intensity (1–256) of falsecolors that will not be displayed.
3. Select the scaling factor (0–1)
4. Subtract the superimposed falsecolor from the underlying gray scale color.

Any pixel in the test set class with falsecolor intensity greater than the threshold selected in (1) will be displayed with color intensity:

pixel_color=gray_scale_color-scaling_factor, falsecolor Optional Step:

To smooth out the effect of the subtraction, adjacent pixels that go from no fat subtraction to fat subtraction should be displayed with the average intensity of the two pixels.

A number of computer configurations can be used for performing the various computer-implemented processes described herein. In one configuration, the computer includes a workstation-type computer such as a Sun IPC® workstation. The workstation can operate under a number of operating systems, preferably a UNIX-based operating system. If desired, the workstation can be coupled by a network link, such as an ethernet link to other workstation and/or external mass storage such as an external tape drive. The network environment can be, for example, X-Windows®, OpenLook®, or other graphical user interface. Although the above-described configuration can be used in connection with the described invention, the detailed implementation of a system for use in implementing the present invention will depend upon the general application. Some applications may need high definition graphics output and moderate speeds while other applications, (e.g., applications requiring a very high throughput or a real-time output) may need very high speed computations but moderate or no graphic interface. Modifications or additions to the above-described configuration which can be used in connection with the present invention include SUN SPARC Classic® or LX Workstation®, or a mainframe system. Memory capacity can include, for example, 16 MB or more random access memory (RAM) and mass storage such as writable optical disks, hard-drive storage such as 200 to 400 MB hard drive capacity. A high resolution 15 or 16 inch (or larger) color monitor can be used for displaying the images herein. Image processing may employ an accelerator card and associated software and output may include black and white or color printer devices. Computing capacity may be increased by use of, e.g., parallel processing cards and associated software and the like.

As described above, the results of the method of the present invention may be displayed by displaying one of the original gray scale MR images, and by color highlighting the pixels of that image that correspond to the most similar samples. As long as the training and test sets are obtained from the same set of images, it is accurate to assume that the nearest X% of samples of the test set are truly similar to the training set. However, this assumption is not necessarily true when the training and test sets are obtained from different sets of images. This can be understood by considering classification of a test set that does not contain any of the training tissue, i.e., the tissue in the region spanned by the training samples. Displaying the nearest 1% of distances will highlight 1% of the test set pixels but these distances will be significantly greater than would have been found had the test set contained the training tissue.

To avoid this problem, one can incorporate distance as a threshold in the display process. In this variation, the present invention preferably identifies the X% of the pixels of the test set that have the smallest distance. Of those samples, only those samples that have distances less than Y are displayed, where Y is a selected threshold. This means that if the user chooses to highlight the most similar 2% of the pixels, and those 2% of pixels have distances less than the threshold distance Y (also chosen by the user), then 2% of the pixels will be highlighted. However if some of those 2% have distances greater than the threshold, then only a portion of the 2% will be highlighted. If none of the nearest 2% has a distance less than Y, then no pixels will be highlighted.

The present invention can be applied so as to permit adjustment of an MRI image to selectively enhance or suppress those portions of the image resulting from a given type of tissue. For example, in many clinical applications, a tissue in which one is interested may be surrounded by another tissue such as fat, that has a similar MRI brightness. However, if the two tissue types can be distinguished using pattern recognition, then the portion of the images corresponding to fat can be reduced in brightness, improving the resolution of the tissue of interest.

Figure 7:
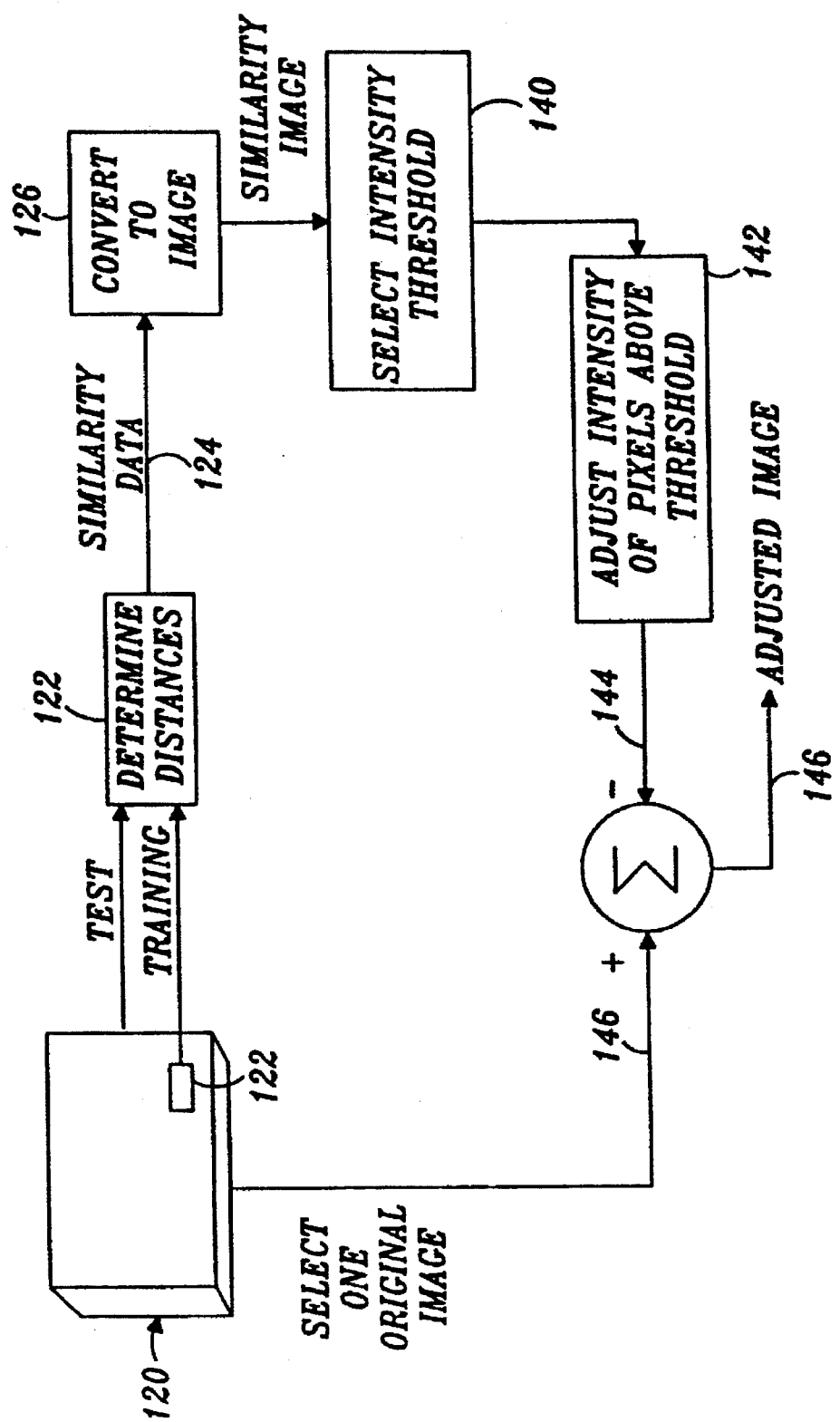
FIG. 7 illustrates adjustment of a portion of an MR image containing a predetermined tissue type.
Figure 8:
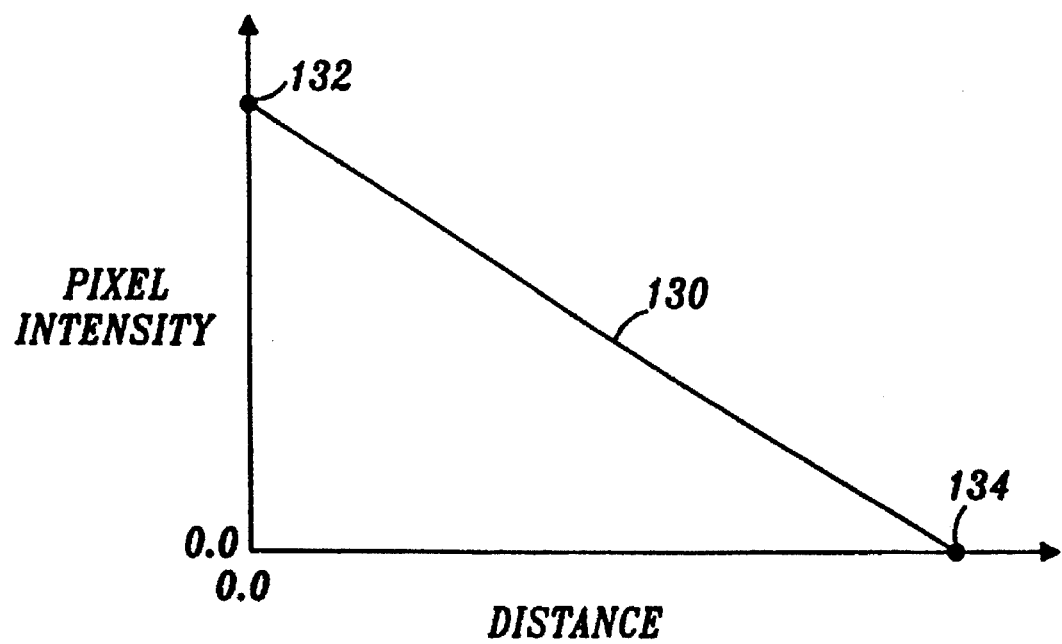
FIG. 8 is a graph showing the conversion of similarity data into an image.

An example of this procedure is illustrated in FIGS. 7-9. The procedure begins, as above, by the generation of a congruent set 120 of images that include a region of interest of a patient. Set 120 preferably includes additional images generated by spatial correlation, as previously described. Set 120 forms the test set, while a small subset 122 is selected to form the training set. The training set is selected such that the training set samples, to the maximum extent possible, correspond only to the tissue type that one wishes to suppress (or enhance).

The test and training set samples are compared in step 122, in the manner described above, to produce similarity data 124 representing the distance between each test set sample and the training set samples. In step 126, the similarity data is converted into a similarity image. The similarity image depicts those portions of the test set region that are similar to the training set. Thus if the training set contains fat tissue, then the similarity image will depict the fat in the test set region. The similarity image may then be displayed, if the goal is to identify other portions of the test region that are similar to the training region. Alternatively, the similarity image may be adjusted, as described below, and then subtracted from one of the original images 120, to selectively suppress the fat portions of the original image.

A suitable technique for producing the similarity image is diagrammed in FIG. 8. Similarity data 124 comprises a distance value for each sample of the test set, the distance value being a measure of the distance of the test sample from the training samples in a multidimensional measurement space. Thus the smaller the distance, the greater the similarity. In FIG. 8, line 130 represents the mathematical relationship used to convert a distance value into a pixel intensity for constructing the similarity image. For zero distance, i.e., identical samples, a maximum pixel intensity 132 is selected. As the distance increases from zero, the assigned pixel intensity decreases, until a cut off distance 134 is reached. For distances equal to or grater than the cut off distance, the pixel intensity is set to zero. In this manner, a pixel intensity is associated with each sample, producing a similarity image congruent with the original images in set 120.

In step 140, an intensity threshold is chosen to enable the user to limit the subtraction to those pixels of the similarity image that are most similar to the training set. In step 142, the pixels of the similarity image that are greater than the threshold are "scaled", preferably by a user-supplied scaling factor between zero and 1. Thus each pixel intensity in the similarity image that is greater than the threshold is multiplied by the scaling factor. The adjusted similarity image, represented by line 144, is then subtracted from one of the original images, represented by line 144, to produce an adjusted image 148 that is displayed. The overall effect of the process is that for samples having a pattern or signature similar to the pixels in training set 122, the intensity is reduced in the adjusted image. The amount of reduction is controlled by the scaling factor applied in step 42. A similar procedure can be used to produce enhancement of selected tissue types.

Figure 9A:
FIGS. 9A and 9B are MR images illustrating fat suppression according to an embodiment of the present invention.
Figure 9B:

An example of the image adjustment process shown in FIGS. 7 and 8 is illustrated in FIGS. 9A and 9B. FIG. 9A shows a conventional $T_1$-weighted MR image through a patient's head. The region behind each eye contains optic nerves and surrounding fat. The fat tends to obscure the optic nerves and would very likely obscure a contrast-enhanced tumor of the optic nerve because both fat and contrast-enhanced tumor have approximately the same intensity. The congruent images for this application were generated by standard $T_1$-weighted and $T_2$-weighted spin-echo sequences. In this case, training set 150 was selected from a region that included fat but not optic nerves. This training set was used to construct a similarity image which was then subtracted from the original image, producing the adjusted image shown in FIG. 9B. Subtraction of the fat portions of the image enables much clearer resolution of the optic nerves themselves.

EXPERIMENTAL

Common Household Liquids

Figure 15A:
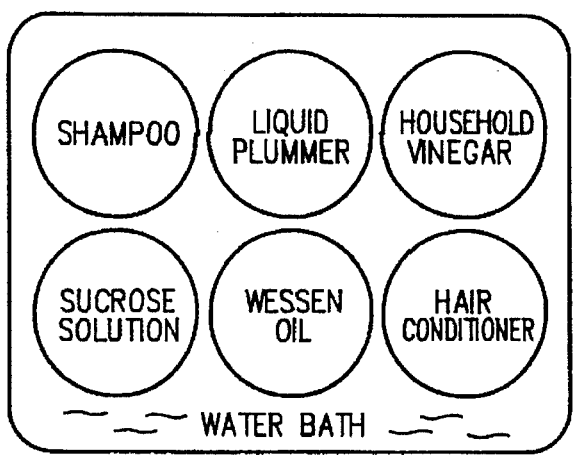
FIGS. 15A–15F depict the results of an application of an embodiment of the invention to analysis of household liquids where cross-hatching indicates regions identified as similar to a training set.

Six 20 cc samples of six different common household liquids were placed in a plastic specimen cup. The six liquids included a commercial hair conditioner, vinegar, cooking oil, a pipe de-clogging composition sold under the tradename LIQUID PLUMMER®, a saturated sucrose solution, and hair shampoo. The specimen cups were placed in a water bath in the configuration shown in FIG. 15A. The intention was to minimize truncation artifact. The water bath containing the samples was scanned using the following sequences: ME-6, STIR, $T_1$-weighted spin-echo. Six training sets were selected, using the techniques described herein, from the interior of each of the six images. Each of the training sets was used to classify a scan through the six samples, using the techniques described herein. The results are depicted in FIGS. 15B–15F, where crosshatching is used to indicate regions that were color-highlighted in the displays. The training sets which produced each of FIGS. 15B–15F are indicated in Table I. As seen in the Figures, the technique successfully identified each liquid, except for the LIQUID PLUMMER®.

TABLE I

| Figure | Selected Training Set |
|---|---|
| 15B | Shampoo |
| 15C | Vinegar |
| 15D | Sucrose Solution |
| 15E | Cooking Oil |
| 15F | Hair Conditioner |

Whole Apples

Figure 16A:
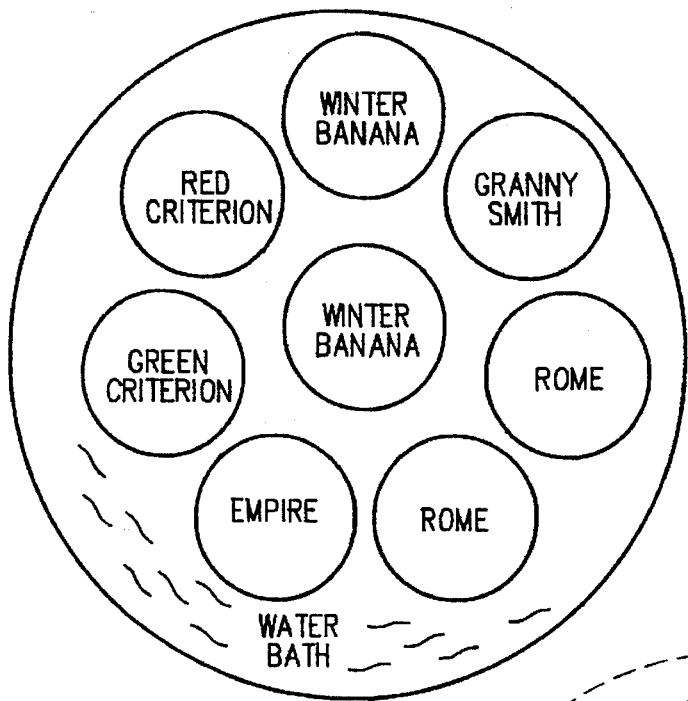
FIGS. 16A–16C depict the results of an application of an embodiment of the invention to analysis of a collection of apples; and, FIGS. 17A–17B depict the results of an application of an embodiment of the invention to analysis of a variety of wines where two types of cross-hatching indicate regions identified as similar to two different training sets.
Figure 16B:
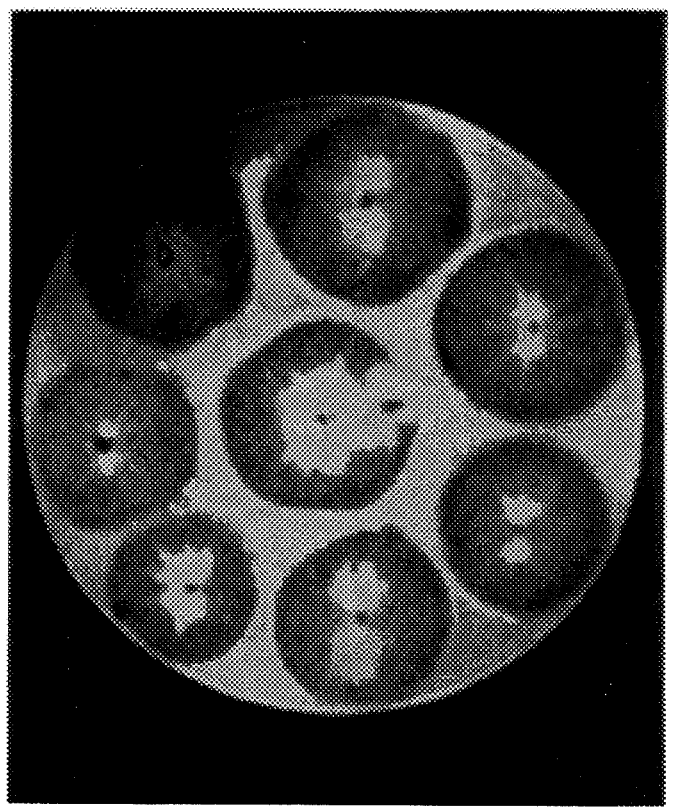
Figure 16C:
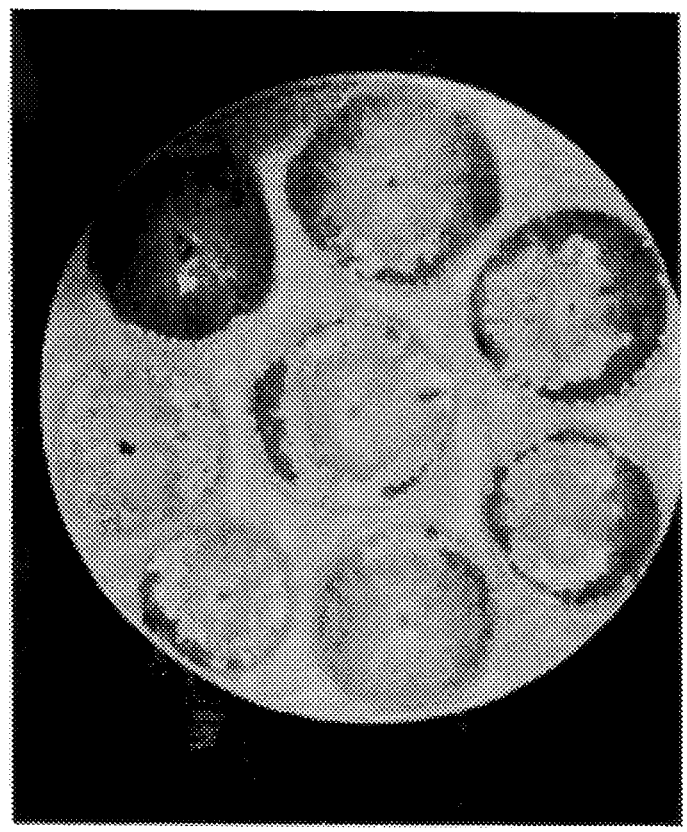

A similar procedures was used for distinguishing among eight unsliced apples consisting of two winter bananas, two Romes, one Granny Smith, one Empire, one green Criterion, and one red Criterion, set out in the configuration depicted in FIG. 16A. The sequences used were: ME-6, STIR (inversion time 100 milliseconds and 200 milliseconds) and $T_1$ weighted spin-echo. Two different classes of training sets were defined, one class near the core and one class near the periphery of the single apple near the center. FIG. 16B depicts, with lighter grey shades, the portion classified with the Core training set. FIG. 16C depicts, with lighter grey shades, the portion classified with the periphery training set. As seen in FIGS. 16B and 16C, the algorithm was able to generalize properties of the core versus periphery training sets to identify core and periphery regions in other varieties of apples.

Red and White Wines

Figure 17A:
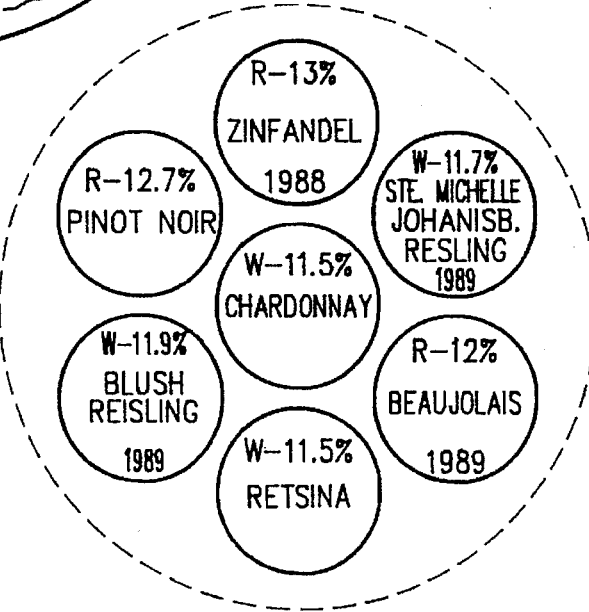
Figure 15B:
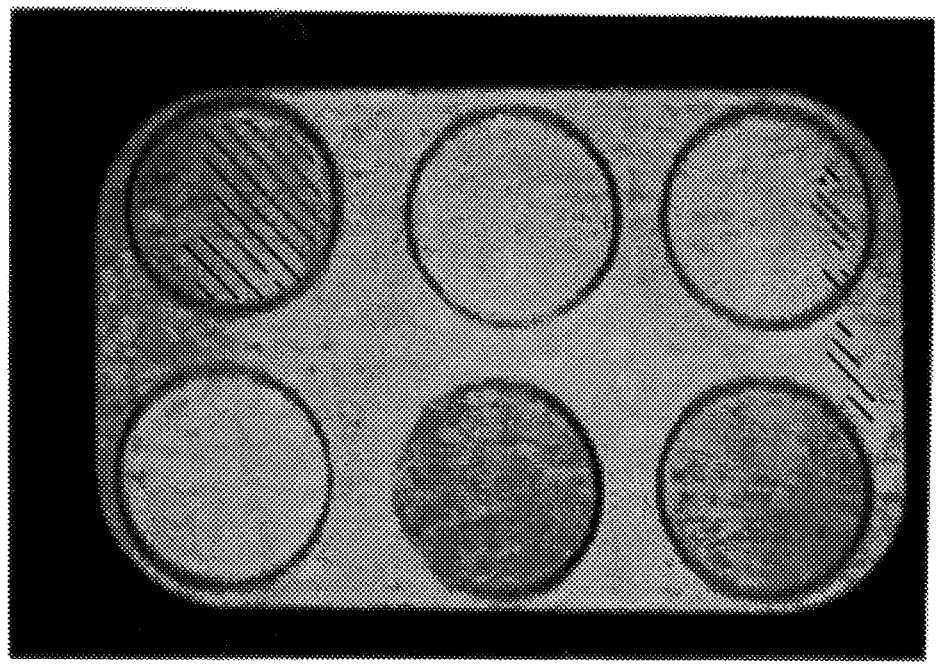
Figure 15C:
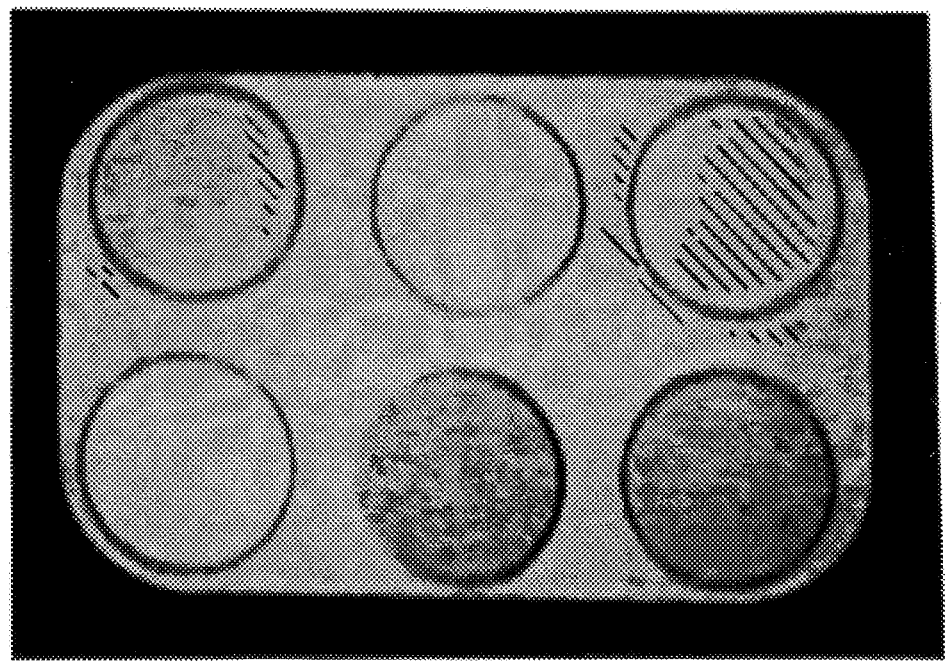
Figure 15D:
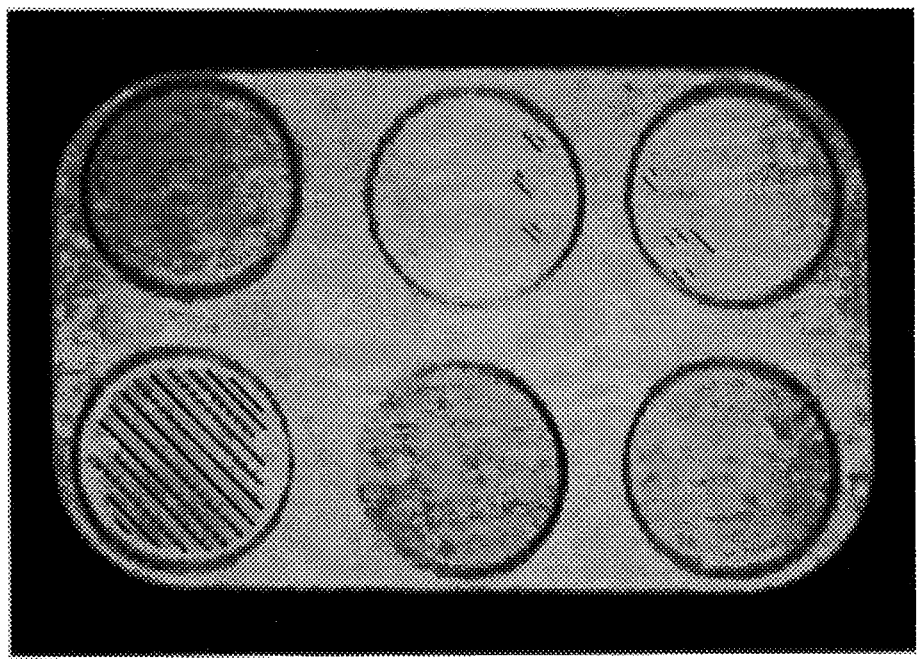
Figure 15E:
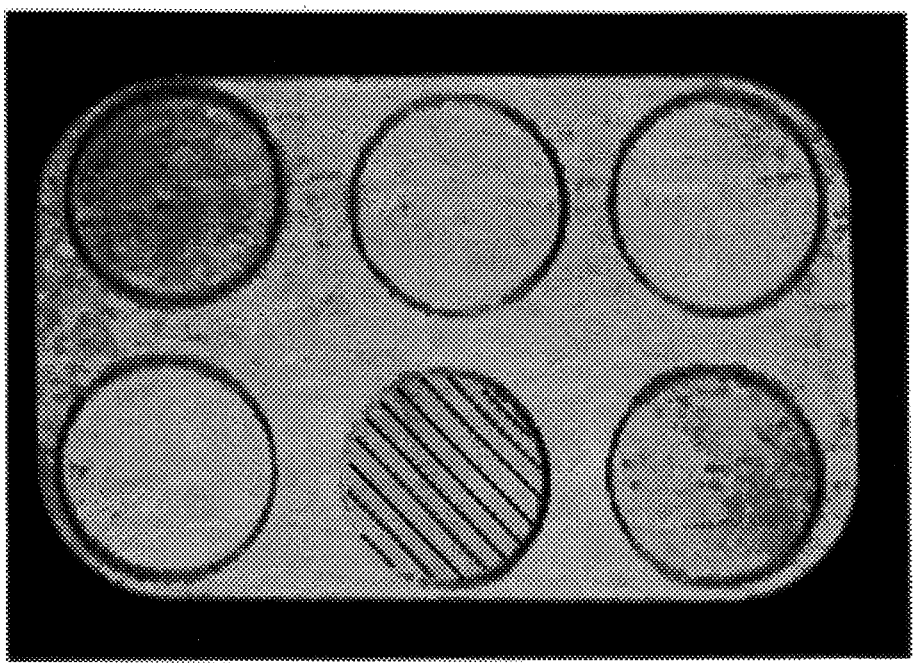
Figure 15F:
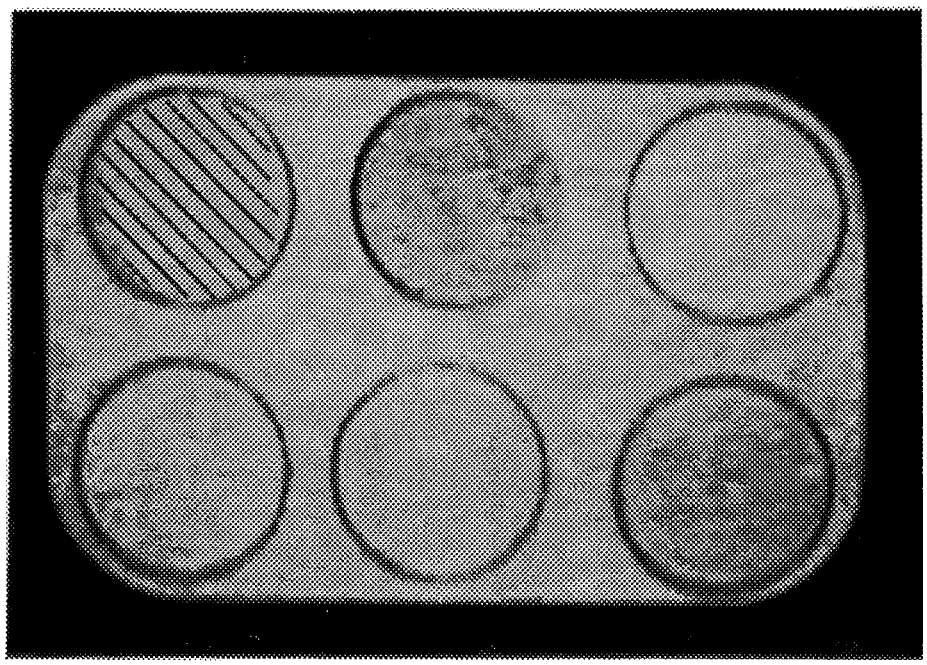
Figure 17B:
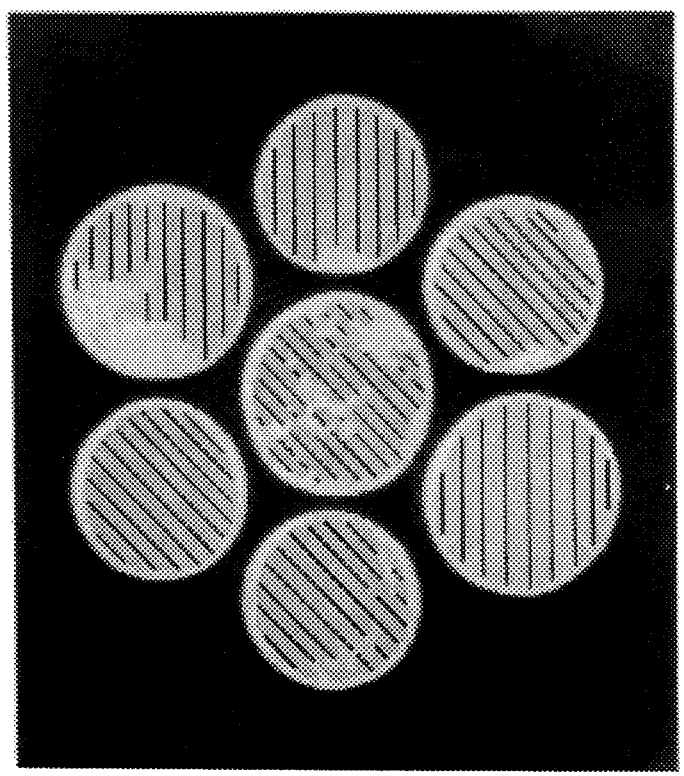

Procedures similar to those described above were used for analyzing seven wines in unopened bottles arranged as shown in FIG. 17A. Percentages indicate alcohol content. In this case, a water bath was not used. The sequences used include: ME-6, STIR (inversion time 100 milliseconds), $T_1$ weighted spin-echo and two field-echo sequences. A first training set was defined using the image from the red wine zinfandel. Another training set was defined based on the white wine Johannesburg Reisling. FIG. 17B depicts, with vertical crosshatching, the portion of the image classified with the first training set and, with diagonal crosshatching, the portion classified with the second training set. As seen in FIG. 17B the method was able to generalize the properties of red wines and identify two other types of red wines (Pinot Noir, Beaujolais). The method was also able to generalize the properties of the white wine to identify three other but different white wines, chardonnay, blush reisling, and retsina.

Surfactants

This experiment was performed using two different complex mixtures of surfactants, A and B, where compound A consists of a mixture of two or more different commercial surfactants, and Compound B consists of a mixture of two or more commercial surfactants. The surfactants present in Compound A are different than those found in Compound B.

The calibration set consisted of seven 25 cc glass vials, each of which contained a different proportion of Compounds A and B, ranging from 48% A to 88% A, two of the vials having the same percentage of Compound A. A 10 mm thick MR section was taken in a plan passing through all seven of the samples, and the following sequences were used to develop MR signatures of the samples: $T_1$-weighted spin-echo, inversion recovery sequences having inversion times of 100, 130, 160, and 200 msec, a 4-echo spin-echo sequence, and two gradient-echo sequences. 25-pixel training sets were taken from each of the seven samples. The test set consists of the entire imaged region that includes all portions of the seven samples. The training sets were scaled.

Figure 18:
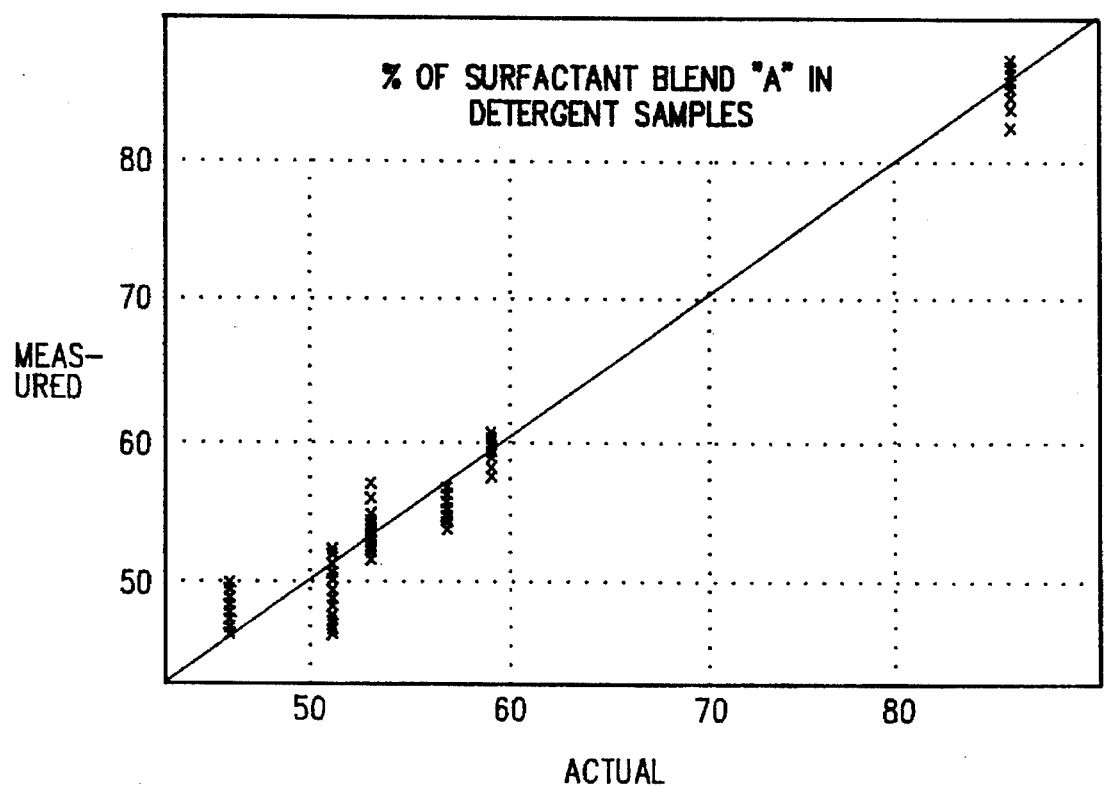
FIG. 18 is a graph showing development of a calibration made for a continuous property.

Calibration was accomplished by using the method of partial least squares to form a 5 principal component model. Results are seen in FIG. 18. The horizontal axis shows the percent of surfactant blend A in the detergent samples, as established by conventional analytic techniques. The vertical axis shows the percent of surfactant blend A in the detergent samples as established by the PLS model. This example represents calibration of first-order MR data.

The calibration model could have been used to determine the percentage of A at each of the 30,000 pixels in the test set. Had this step been taken, percentage of A could have been displayed e.g. as a false color image of the test set with color proportional to percentage of A.

While the preferred embodiment of the invention has been illustrated and described, it will be appreciated that various changes can be made therein without departing from the spirit and scope of the invention.

What is claimed:

1. A computer-implemented method for estimating the magnitude of at least a first property of a first sample of a first substance based on nuclear magnetic resonance (MR) measurements comprising:

obtaining a first plurality of MR measurements comprising a set of measurements of a plurality of calibration samples of a material which includes said first substance, said plurality of calibration samples being different from said first sample and including a first plurality of values of said first property, each of said first plurality of nuclear MR measurements formed using at least first and second different pulse sequences, and encoded with spatial position information for each of said plurality of calibration samples;

defining a first mapping from a first set of values, based on said first plurality of nuclear MR measurements, to a set of values of said first property, said mapping being continuous over at least a first domain of values of said first property;

obtaining a second plurality of nuclear MR measurements of said first sample using at least said first and second pulse sequences, each of said second plurality of nuclear MR measurements encoded with spatial position information; and calculating an estimated value of said first property by applying said first mapping to a second set of values based on said second plurality of nuclear MR measurements wherein said estimated value is different from any of said first plurality of values of said first property.

2. A computer-implemented method, as claimed in claim 1, wherein said substance comprises non-living material.

3. A computer-implemented method, as claimed in claim 1, wherein said substance comprises a living body.

4. A computer-implemented method, as claimed in claim 1, wherein said substance comprises in vitro material derived from a living body.

5. A computer-implemented method, as claimed in claim 4, wherein said living body is a living human body.

6. A computer-implemented method, as claimed in claim 1, wherein said step of defining said first mapping includes defining a mapping which predicts a value of said first property based on a plurality of MR measurements.

7. A computer-implemented method, as claimed in claim 1, said first mapping provides a value of said first property using a method selected from among PLS, PCR, LWR, PPR, ACG, MARS AND NN.

8. A computer-implemented method, as claimed in claim 1, wherein said step of obtaining a first plurality of MR measurements includes forming a plurality of congruent sets of images.

9. A computer-implemented method, as claimed in claim 1, further comprising standardizing said first plurality of MR measurements, using at least a first reference object.

10. A computer implemented method, as claimed in claim 1, further comprising standardizing said second plurality of MR measurements, using at least a first calibration object.

11. A computer-implemented method, as claimed in claim 1, further comprising storing, in memory, values characterizing said mapping.

12. A computer-implemented method, as claimed in claim 1, further comprising:

defining a second mapping from a set of values, based on said first plurality of MR measurement, to a set of values of a second property different from said first property and calculating an estimated value of said second property using said second mapping.

13. A-computer-implemented method, as claimed in claim 1, wherein said first plurality of values consists of only two values of said first property.

14. A computer-implemented method, as claimed in claim 1, wherein said step of defining a mapping includes defining groups of said MR measurements using cluster analysis.

15. A computer-implemented method for estimating the magnitude of at least a first property of a first sample of a first substance of unknown composition based on nuclear magnetic resonance (MR) imaging measurements, comprising:

obtaining a first plurality of imaging measurements using a MR apparatus, said imaging measurements comprising a set of measurements of a plurality of calibration samples of a material which includes said first substance, said plurality of calibration samples being different from said first sample and including a first plurality of values of said first property, each of said first plurality of imaging measurements including a first group of measurements formed while said MR apparatus has a first pulse sequence configuration and a second group of measurements formed while said MR apparatus has a second pulse sequence configuration, wherein said first and second groups of measurements are independent;

defining a first mapping from a first set of values, based on said first plurality of imaging measurements, to a set of values of said first property;

obtaining a second plurality of imaging measurements, using an MR apparatus, of said first sample, including at least measurements with said first pulse sequence configuration and measurements with said second pulse sequence configuration; and calculating an estimated value of said first property using said first mapping.

* * * * *